United States Patent [19]
Zarubinsky et al.

[11] Patent Number: 5,903,232
[45] Date of Patent: May 11, 1999

[54] APPARATUS AND METHOD FOR SAMPLING RATE CONVERSION WITH RATIONAL FACTORS

[75] Inventors: Michael Zarubinsky, Jerusalem; Vladimir Koifman, Rishon Le Zion; Eliezer Sand, Hod Hasharon, all of Israel

[73] Assignee: Motorola Inc., Austin, Tex.

[21] Appl. No.: 08/943,715

[22] Filed: Oct. 3, 1997

[51] Int. Cl.$^6$ .................................................. H03M 7/00
[52] U.S. Cl. .......................................... 341/61; 364/724.1
[58] Field of Search ............................... 341/50, 61, 143; 364/724.1

[56] References Cited

U.S. PATENT DOCUMENTS

| | | | |
|---|---|---|---|
| 5,212,659 | 5/1993 | Scott et al. | 364/724.1 |
| 5,389,923 | 2/1995 | Iwata et al. | 341/61 |
| 5,475,628 | 12/1995 | Adams et al. | 364/724.1 |
| 5,621,404 | 4/1997 | Heiss et al. | 341/61 |
| 5,633,633 | 5/1997 | Nakano | 341/61 |
| 5,717,617 | 2/1998 | Chester | 364/724.1 |
| 5,719,571 | 2/1998 | Akume et al. | 341/61 |

OTHER PUBLICATIONS

"Application of filter sharpening to cascaded integrator-comb decimation filters", by Kwentus, A.Y.; Zhongnong Jiang; Wilson, A.N., Jr., IEEE Transactions on Signal Processing vol. 45, No. 2 pp. 457–467.

"Delta Sigma Data Converters, Theory, Design, and Stimulation" by Norsworthy S. R., Schreier R., Temes G.C., IEEE Circuits & Systems Society, Sponsor, 1997, pp. 422–430.

"Splitting the unit delay, Tools for fractional delay filter design", by Laakso T., I.; Välimäki V.; Karjalainen M.; Laine U. K., IEEE Signal Processing Magazine, Jan. 1996, pp. 30–60.

"Multirate Filter Designs Using comb Filters" by Shuni Chu, Burrus S., IEEE Trans. Circuits and Sys, vol. CAS–31, No. 11 Nov. 1984, pp. 405–416.

"The application of multi–rate digital signal processing techniques to the measurement of power system harmonic levels", by Miller A. J.V., Dewe M.B., IEEE Transactions on power delivery, vol. 8, No. 2, Apr. 1993. pp. 531–539.

"A VLSI architecture for a universal high–speed multirate FIR digital filter with selectable power–of–two decimation/interpolation ratios", by Samueli, H.; Lin, T.–J., Conference Title: ICASSP 91. 1991 International Conference on Acoustics, Speech and Signal Processing (Cat. No.91CH2977–7) pp. 1813–1916 vol. 3, Publisher: IEEE, New York, NY, USA.

"A VLSI decimation filter for sigma–delta A/D converters" by Mok K. Y. F, Constantinides A., G., Cheung P. Y. K., Advanced A–D and D–A conversion techniques and their applications, Jul. 6–8, 1994, Conference publication No. 393, IEE 1994, pp. 36–41.

"A Multi–channel decimator for a tri–level delta–sigma modualtor" by Bernadas S., Thompson Ch., 1994 IEEE, pp. II–517–II519.

"Interpolation and decimation of digital signals–a tutorial review" by Crochiere R.E., Rabiner L.R., Proceedings of the IEEE, vol. 69, No. 3, Mar. 1981, pp. 300–331.

Proakis, J. G., Manolakis, D. G., "Digital Signal Processing", Third Edition, Prentice Hall, Englewood Cliffs, 1996, chapter 3.1. "Z–Transform", on pp. 151–160 and pp. 782–810.

Primary Examiner—Marc S. Hoff

[57] ABSTRACT

A rational decimation circuit (200) has an integration filter (210) and an FIR-filter (220). The integration filter (210) has N serially arranged integrator blocks (230-n) and an interpolator block (250). The FIR-filter (220) has K filter channels (260-k) and a commutator (290) which are controlled by a control block (300). Each channel (260-k) has a multiplier unit (270-k) and an accumulator unit (280-k).

The integration filter (210) has a transfer function with N-fold poles and the FIR-filter (220) has a transfer function with zeros which cancel the poles. FIR-coefficients $h_k(T_V)$ in the FIR-filter (220) are related to the $F_V/F_X$ ratio of the interpolator block (250) and to the number N of integrator blocks (230-n). A method is also described.

23 Claims, 10 Drawing Sheets

FIG. 3    600  PRIOR ART

APPARATUS AND METHOD FOR SAMPLING RATE CONVERSION WITH RATIONAL FACTORS

FIELD OF THE INVENTION

The present invention generally relates to electronic circuits, and, more particularly to a circuit which converts sampling rates of digital signals.

BACKGROUND OF THE INVENTION

Digital signal processing (DSP) is concerned with the representation of signals by sequences of numbers or symbols ("digits") and the processing of these digital signals ("time discrete signals"). DSP has a wide variety of applications and its importance is evident in such fields as radio communication, telecommunications, pattern recognition, and many others. It is often required to change sampling rates of these signals in sampling rate converters. For the application of sampling rate converters, the following references are useful:

[1] Crochiere, R. E. and Rabiner, L. R.: "Interpolation and Decimation of Digital Signals—A Tutorial Review", Proceedings of the IEEE, vol. 69, No. 3, March 1981;

[2] Proakis, J. G., Manolakis, D. G.: "Digital Signal Processing", Third Edition, Prentice Hall, Upper Saddle River, 1996, ISBN 0-13-373762-4, sections 10.1 to 10.6 of chapter 10 "Multirate Digital Signal Processing";

[3] Norsworthy, S. R., Schreier, R., Temes, G. C.: "Delta-Sigma Data Converters", IEEE Press, New York, 1997, ISBN 0-7803-1045-4; and

[4] Chu, Shuni; Burrus, C. S.: "Multirate Filter Designs Using Comb Filters", IEEE Transactions on Circuits and Systems, vol. CAS-31, pages 913–924, November 1984.

According to reference [1], by "decimation", the sampling rate F of a given digital signal is digitally converted to a lower sampling rate F'(F'<F) by a factor M, called the "decimation factor"; and by "interpolation", the sampling rate F is converted to a higher sampling rate F'(F'>F) by a factor L, called the "interpolation factor". [1] also teaches sampling rate converting by, for example, interpolators (sampling rate expanders), decimators (sampling rate compressors), low-pass filters, sample- and hold circuits, finite impulse response filters (FIR) in polyphase structures with commutators and by other means. [1] discusses the quality of sampling rate conversion by frequency spectra. While factors M and L are, conveniently, integers, modern telecommunication applications often require rational conversion factors, such as M/L. FIG. 4 of [1] illustrates a cascade of an integer interpolator and an integer decimator for achieving rational conversion.

In the art, the term "down-sampling" is used as a synonym for "decimating", and the "up-sampling" is used for "interpolating".

The present invention seeks to provide an improved circuit for sampling rate conversion which mitigates or avoids disadvantages and limitations of the prior art.

DETAILED DESCRIPTION OF A PREFERRED EMBODIMENT

Figure 1:
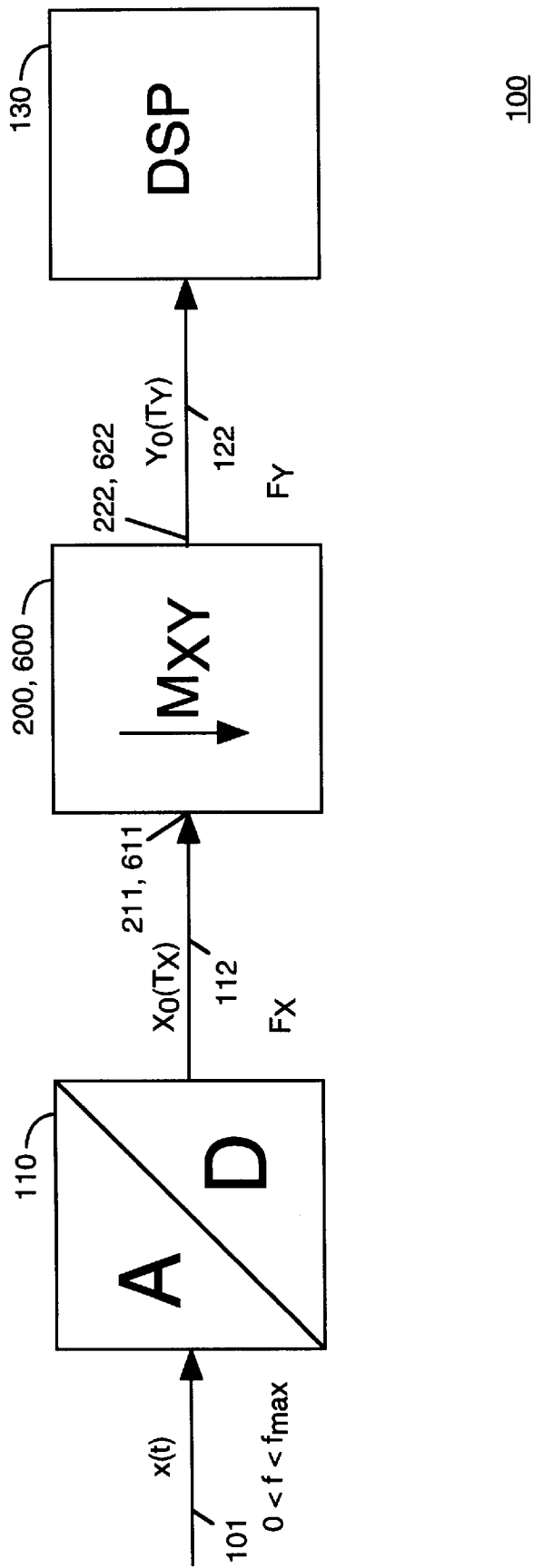
FIG. 1 illustrates a simplified block diagram of data processing system.
Figure 2:
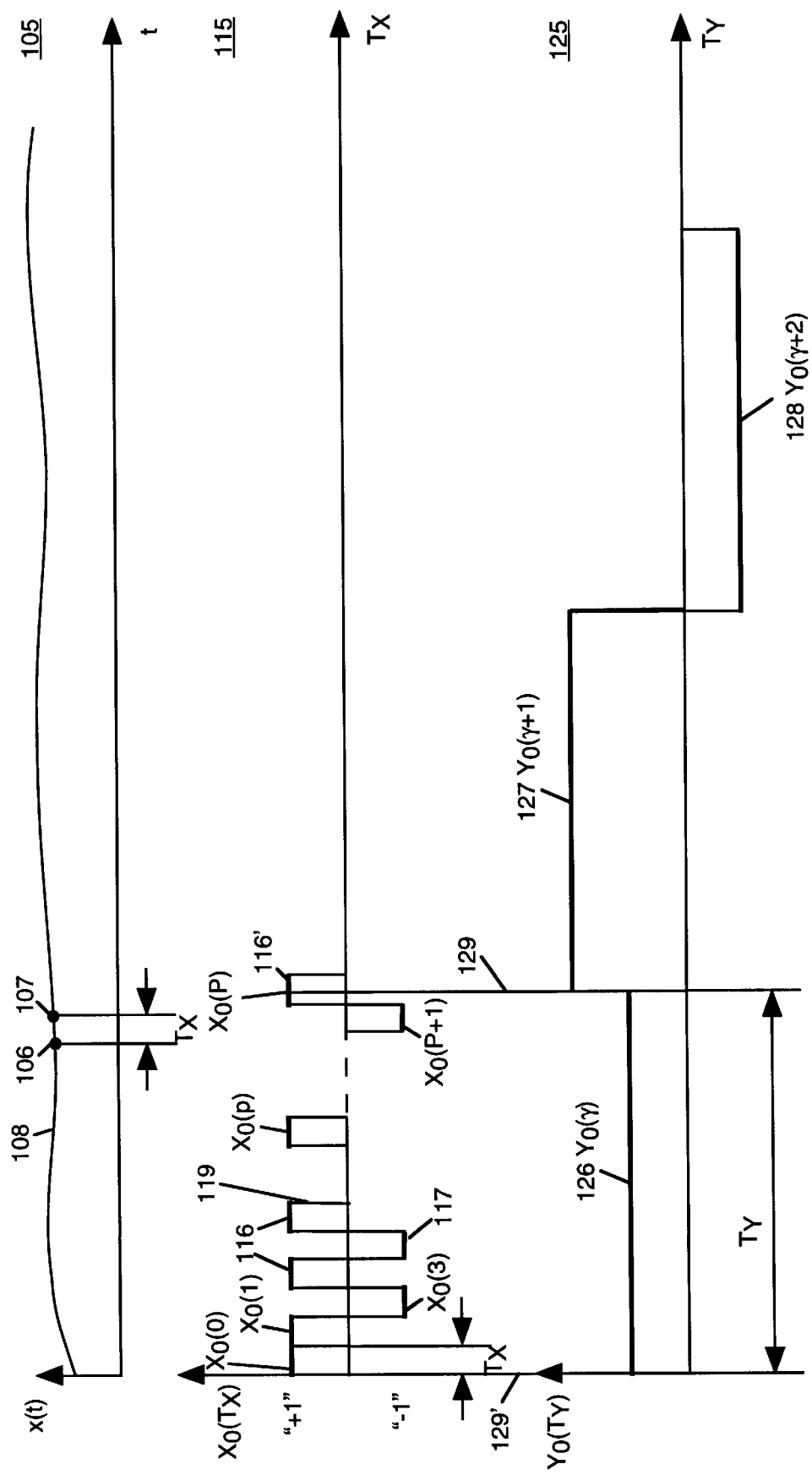
FIG. 2 illustrates simplified time diagrams for an analog signal and for digital signals occurring in the system of FIG. 1.
Figure 3:
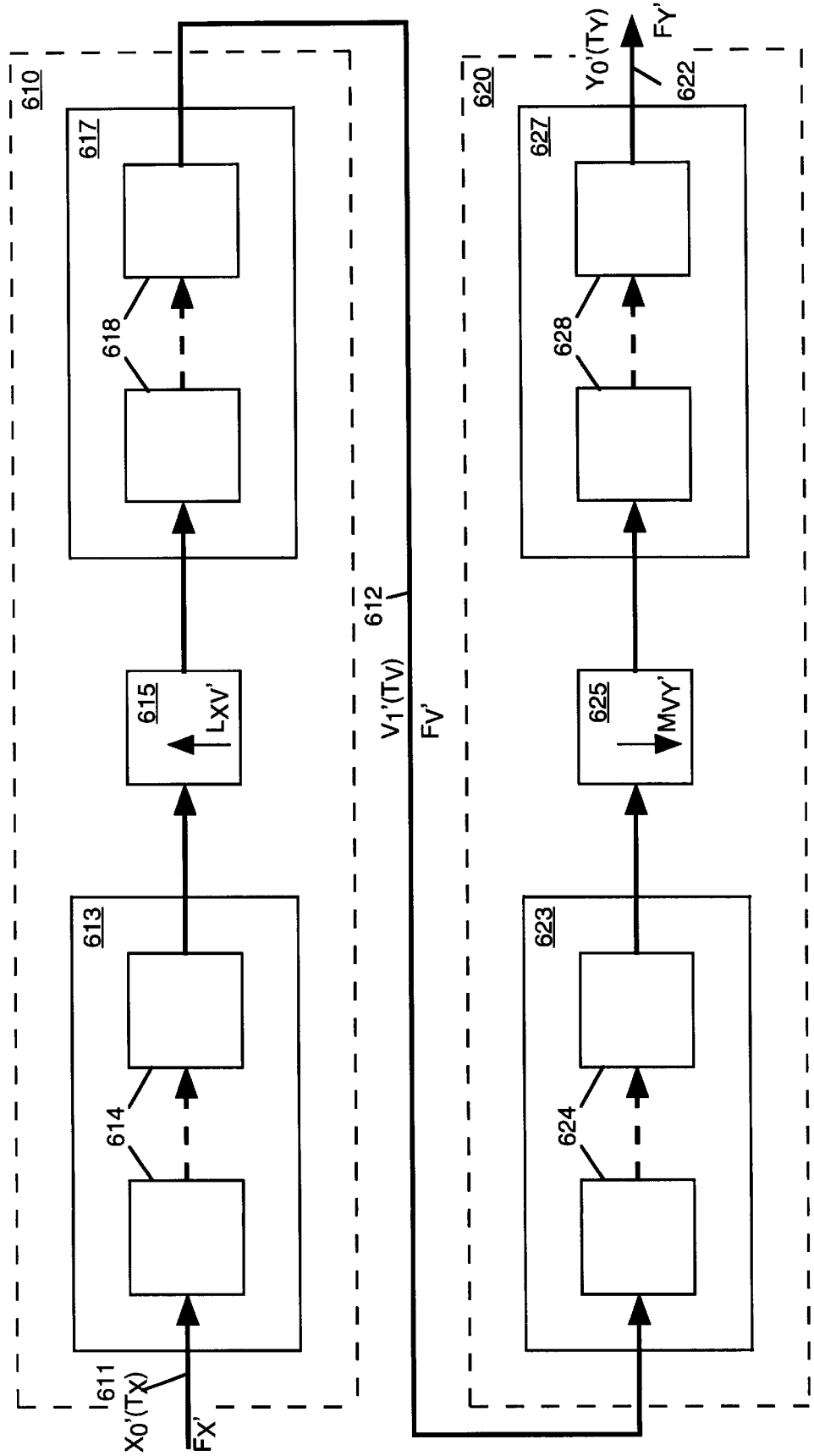
FIG. 3 illustrates a simplified block diagram of a rational decimation circuit of the prior art which can be used in the data processing system of FIG. 1.
Figure 4:
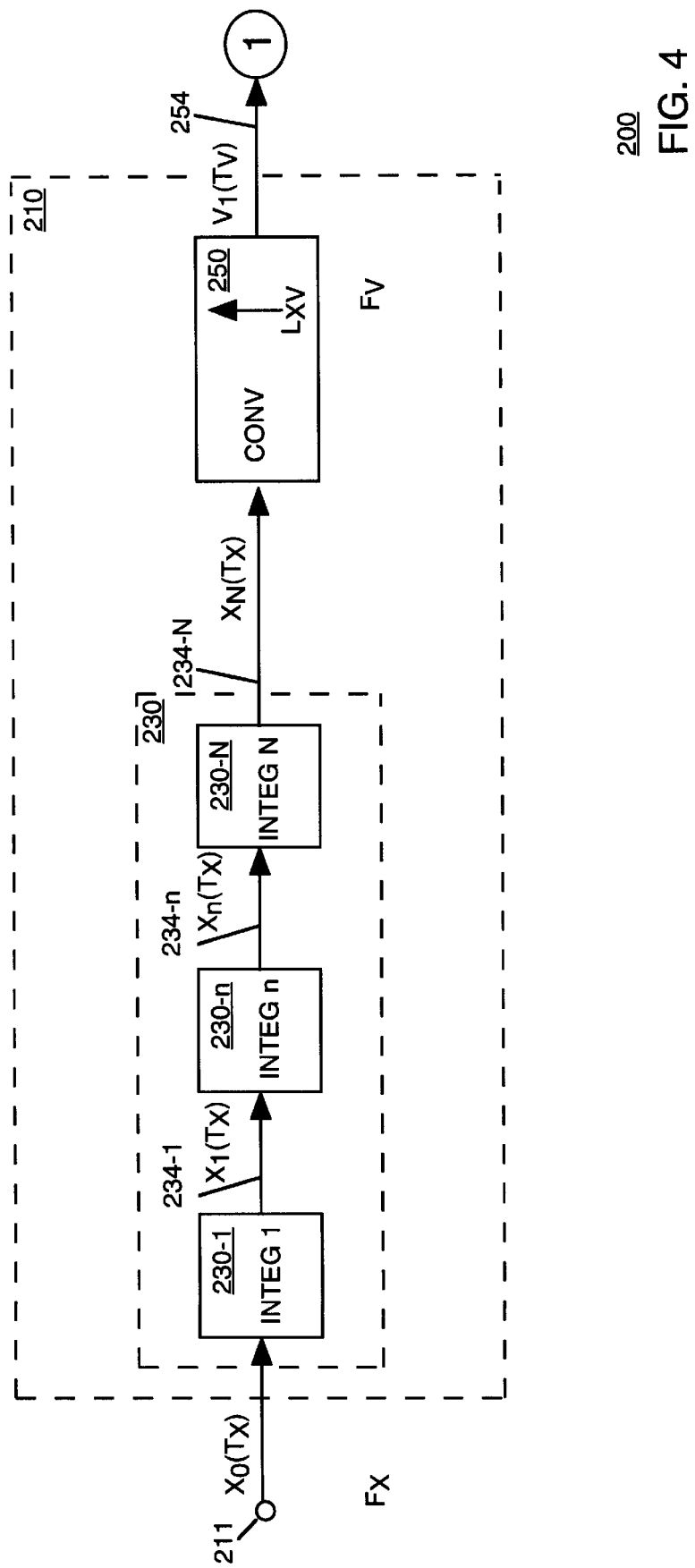
FIGS. 4–5 illustrate a simplified block diagram of a rational decimation circuit of the present invention which is preferably used in the system of FIG. 1.
Figure 5:
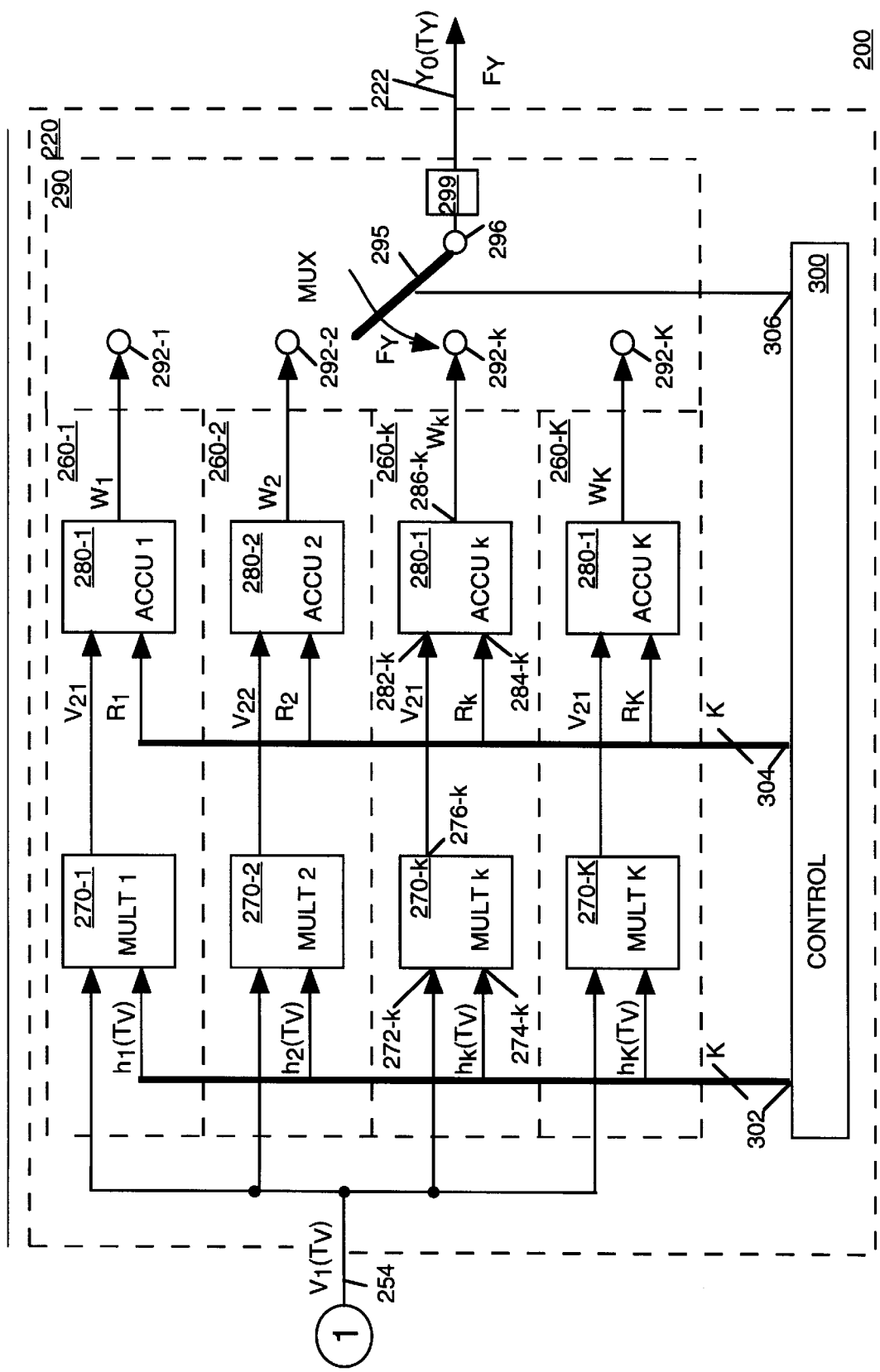
Figure 6:
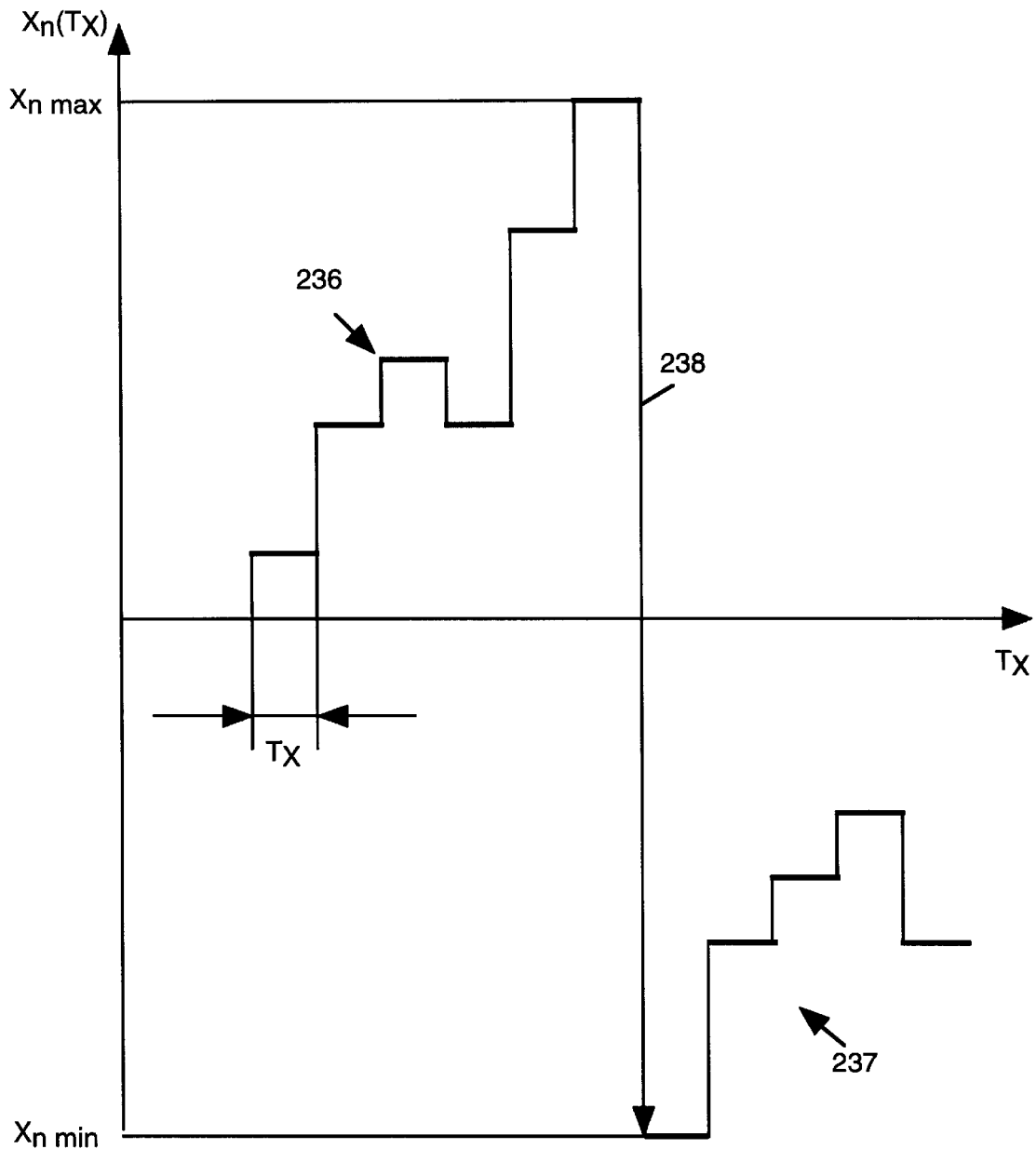
FIG. 6 illustrates a simplified time diagram of a digital intermediate signal.
Figure 7:
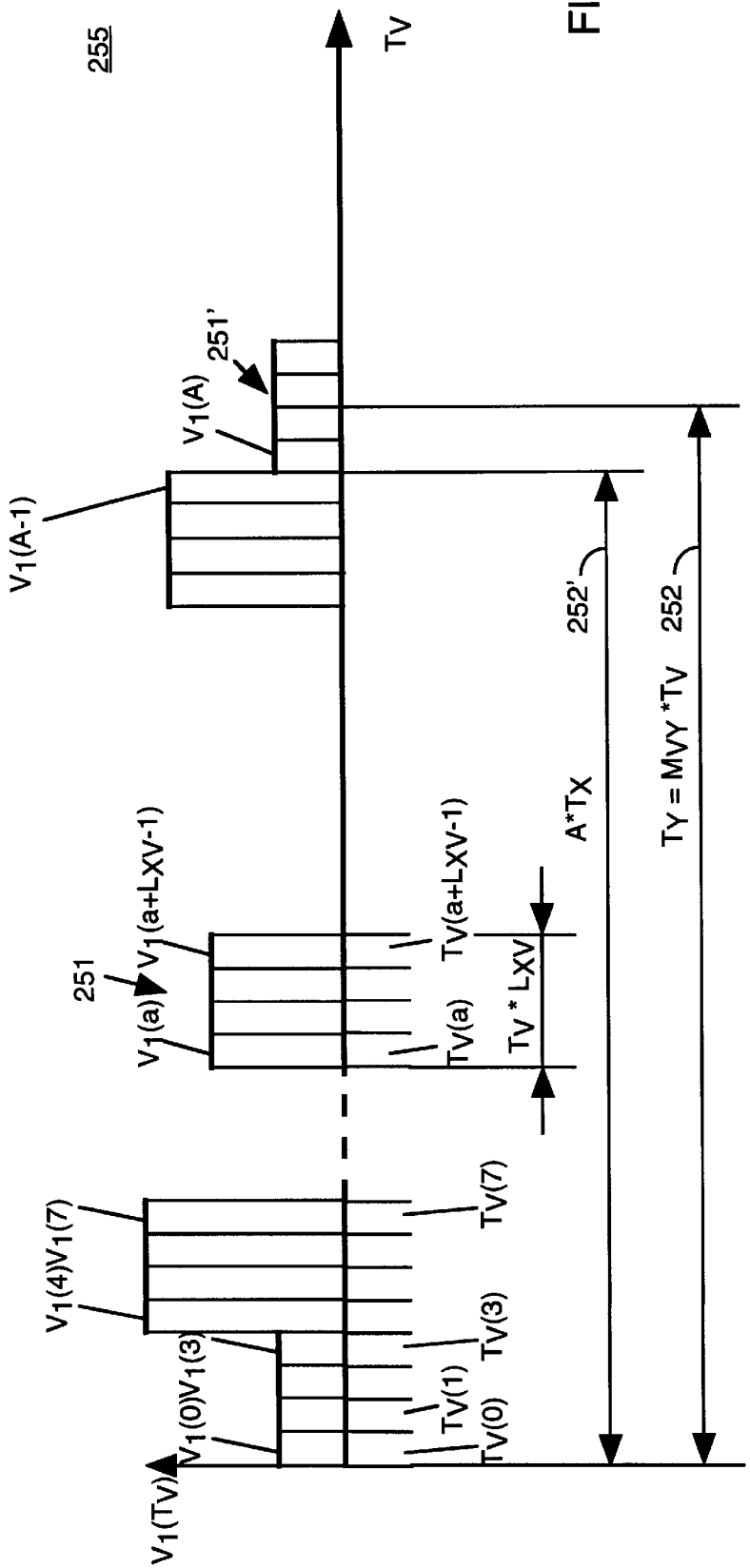
FIG. 7 illustrates a simplified time diagram of a further digital intermediate signal.
Figure 8:
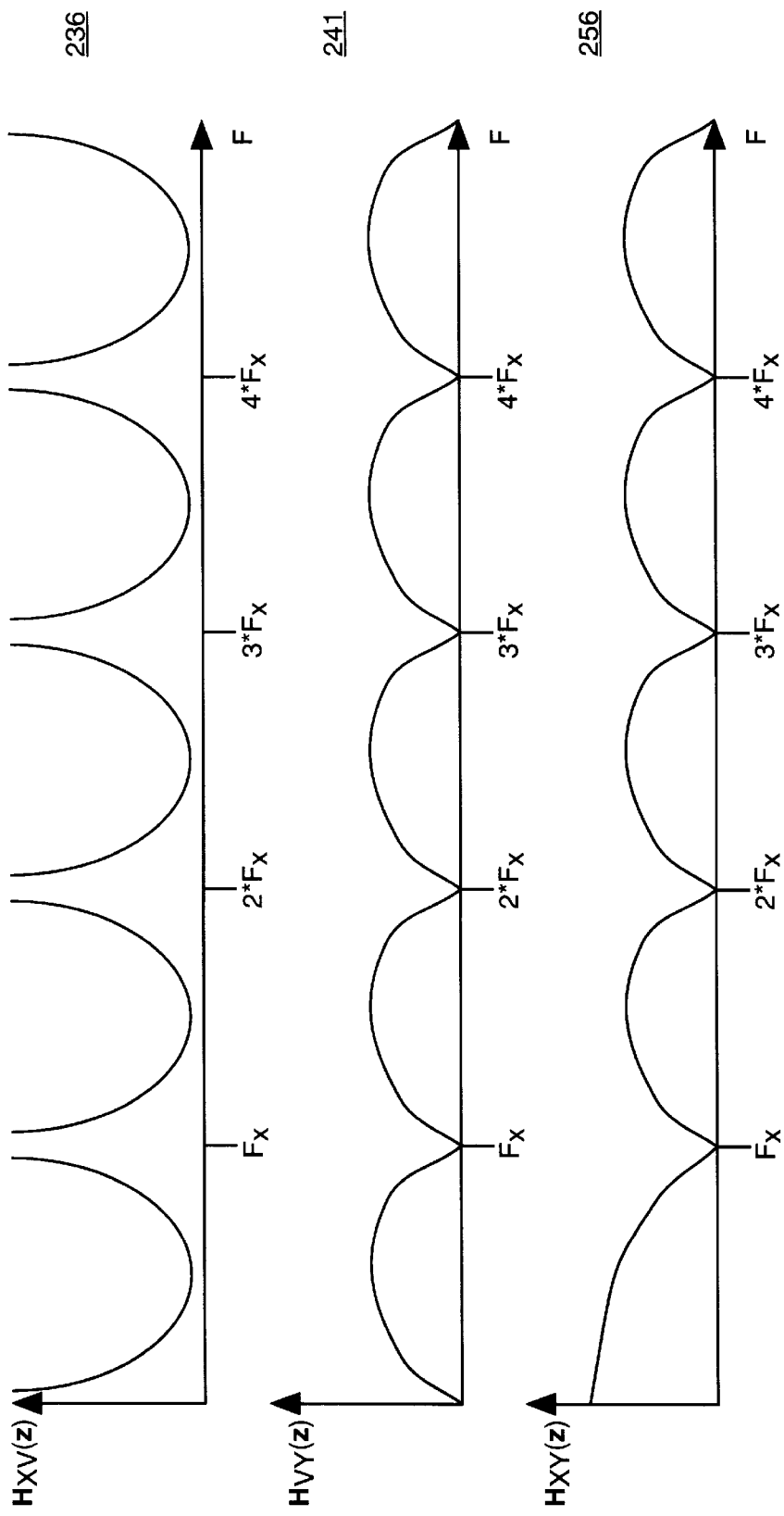
FIG. 8 illustrates simplified spectra of digital signals occurring in the circuit of FIGS. 4–5 and of transfer functions of elements of the circuit of FIGS. 4–5.
Figure 9:
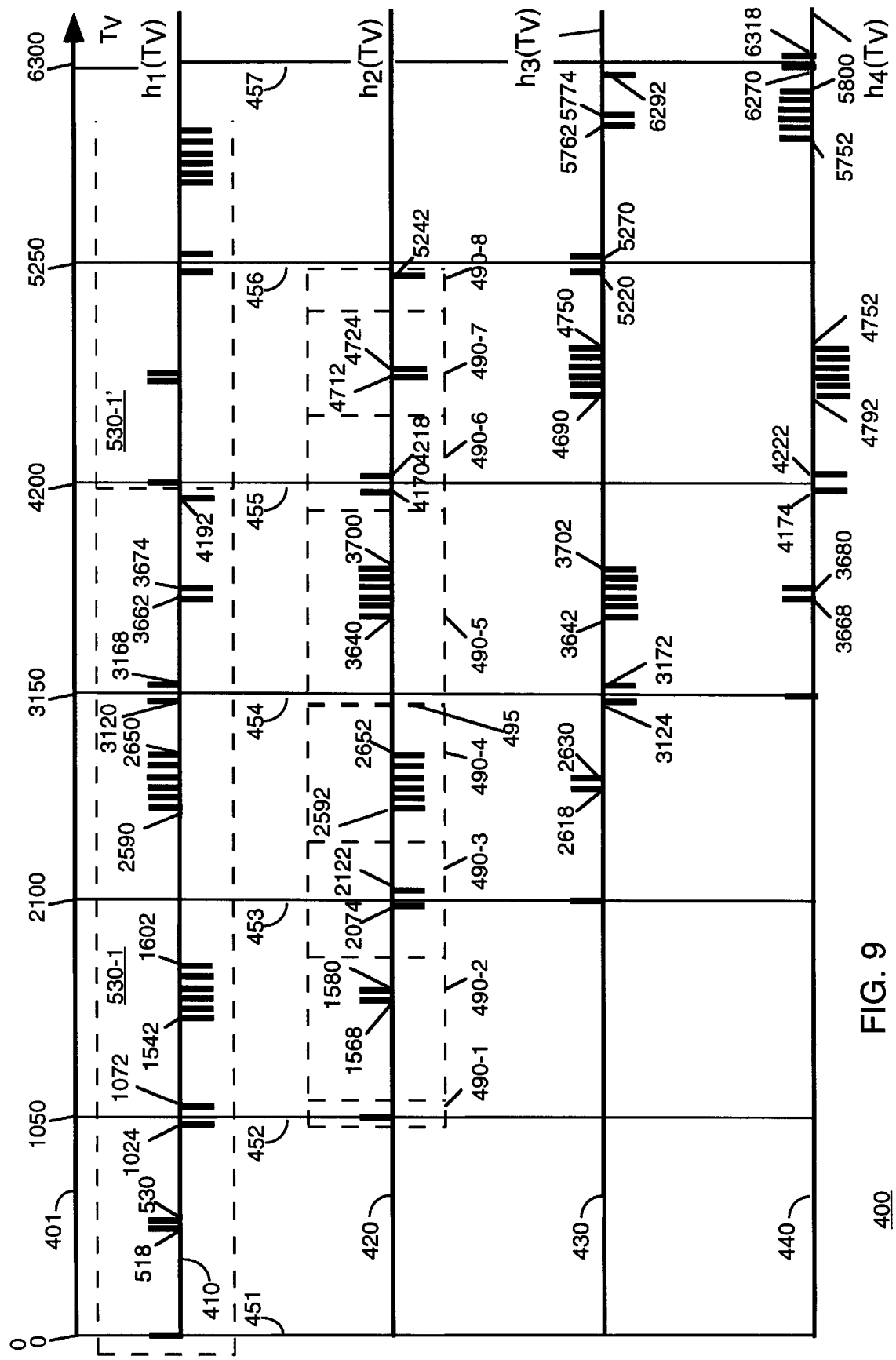
FIG. 9 illustrates a simplified time diagram of coefficients provided by a control block and supplied to channels in the system of FIGS. 4–5.
Figure 10:
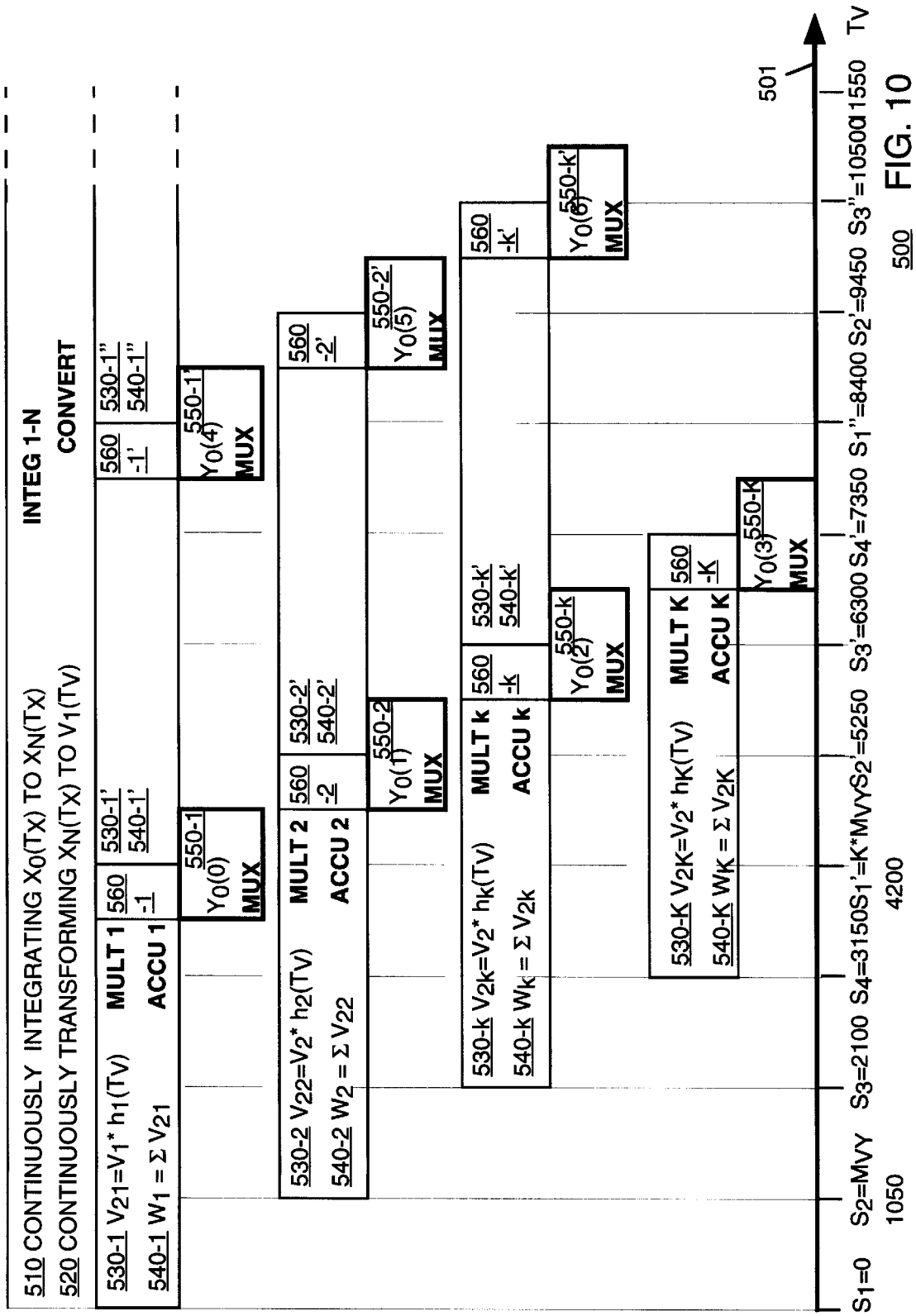
FIG. 10 illustrates a simplified flow chart diagram of a method according to the present invention.

For convenience, a glossary of terms used here and their definitions is provided prior to the claims. Apparatus and method of the present invention are explained in the following order: (a) in the text, introducing conventions for a Z-transformation of signals; (b) by FIG. 1, illustrating data processing system 100; (c) by FIG. 2, illustrating signals x(t), $X_0(T_X)$ and $Y_0(T_Y)$ in system 100; (d) by FIG. 3, illustrating prior art rational decimation circuit 600; (e) by FIGS. 4–5, illustrating rational decimation circuit 200 of the present invention; (f) by FIG. 6, illustrating signal $X_n(T_X)$ occurring in circuit 200; (g) by FIG. 7, illustrating signal $V_1(T_V)$ occurring in circuit 200; (h) by FIG. 8, illustrating signal spectra for explaining frequency transfer functions $H_{XV}(Z)$ and $H_{VY}(Z)$; (i) in the text, explaining a preferred FIR-function; (j) in the text, explaining further modifications of the FIR-function; (k) in the text in connection with tables I and II, explaining FIR-coefficients of the FIR-function; (l) explaining further details of the FIR-function; (m) in the text with table III and by FIG. 9, illustrating the generation of the FIR-coefficients; (n) by FIG. 10, illustrating a method of the present invention; and (o) further discussion of the present invention.

(a)

A discrete time signal $\Theta(v)$ has substantially constant magnitudes $\Theta$ during a discrete time interval T which is counted by v. Intervals T can be identified by other integer numbers, such as e.g., T=0, T=1, T=2 and so on, or by indices, such as, e.g., p, P, a, v, or γ. A Z-transform $Z\{\Theta(v)\}$ of signal $\Theta(v)$ can be calculated by:

$$Z\{\Theta(\vartheta)\} = \sum_{\vartheta=-\infty}^{\infty} (\Theta(\vartheta) * z(-\vartheta)) \tag{a.1}$$

wherein the z is the dimensionless Z-transformation operator. The Z-transformation operator is described, for example, in section 3.1 ("The Z-transform") of [2]. The notation $z(-v)$ represents the function $z^{-v}$. This convention is used hereafter. The Z-transformation is useful also for expressing frequency transfer functions H(z). The present invention uses discrete time signals $\Theta(v)$ written as $X_0(T_X)$, $V_1(T_V)$ and $Y_0(T_Y)$ and others which can are based on different time intervals $$T_V < T_X < T_Y \tag{a.2}$$

with $$T_X = T_V * L_{XV} \text{ and} \quad (a.3)$$

$$T_Y = T_V * M_{VY} \quad (a.4)$$

For further explanations, unless otherwise specified, the Z-transformations are referred to the shortest time interval $T_V$ counted by v':

$$Z\{\Theta(\vartheta')\} = \sum_{\vartheta'=-\infty}^{\infty} (\Theta(\vartheta') * z(-\vartheta') \quad (a.5)$$

This is convenient for explanation by not essential for the present invention. For example, to obtain the Z-transform $Z\{\Theta(T_X)\}$ of $\Theta(T_X)$, time interval $T_V$ of equation (a.5) is substituted by $T = T_V * L_{XV}$:

$$Z\{\Theta(\vartheta')\} = \sum_{\vartheta'=-\infty}^{\infty} (\Theta(\vartheta' * L_{XV}) * z(-\vartheta' * L_{XV}) \quad (a.6)$$

(b)

FIG. 1 illustrates a simplified block diagram of data processing system 100 (hereinafter system 100). System 100 comprises analog-to-digital (A/D) converter 110, rational decimation circuit 200 (hereinafter circuit 200), and processor 130 which are coupled in a chain. Circuit 200 is preferably, implemented according to the present invention, while A/D converter 110 and processor 130 can be circuits known in the art. Circuit 200 of the present invention and a preferred method of its operation are explained in connection with FIGS. 2 and 4–10. To distinguish circuit 200 of the present invention over the prior art, prior art circuit 600 is explained in connection with FIG. 3. Prior art circuit 600 can be used instead of circuit 200.

System 100 can be used in a variety of telecommunication and other applications. Conveniently, system 100 can be part of cellular phones operating according to international standards, such as for example CDMA (Code Division Multiple Access) and GSM (Global System for Mobile Communication).

A/D converter 110 is, preferably a sigma-delta modulator. A/D converter 110 receives analog input signal x(t) (reference number 101) and provides digital signal $X_0(T_X)$ (reference number 112). Decimation circuit 200 receives $X_0(T_X)$ at input terminal 211 and provides digital signal $Y_0(T_Y)$ (reference number 122) at output terminal 222. Or, prior art circuit 600 transfers signals from input terminal 611 to output terminal 622. Preferably, processor 130 is a digital-signal processor (DSP) which further processes $Y_0(T_Y)$.

Analog signal x(t) has frequency components f=0 to a maximum frequency $f_{max}$. For example, x(t) can be a voice signal with $f_{max}$=8 kHz. Preferably, digital signal $X_0(T_X)$ has a sampling rate $F_X$ in the megahertz (MHz) region, with for example, $$F_{X\ CDMA} = 4.2 \text{ MHz (for CDMA), and} \quad (b.1)$$

$$F_{X\ GSM} = 6.5 \text{ MHz (for GSM)} \quad (b.2)$$

but other values or also possible. Decimation circuit 200 digitally converts sampling rate $F_Y$ of $X_0(T_X)$ to a lower sampling rate $F_Y$ of $Y_0(T_Y)$ by rational overall decimation factor $M_{XY}$:

$$F_X > F_Y \quad (b.3)$$

$$F_Y = F_X / M_{XY} \quad (b.4)$$

For convenience, factor $M_{XY}(M_{XY}>1)$ has indices "X" and "Y" indicating a conversion direction "from X to Y". The same convention is followed with respect to other factors, such as "$L_{XV}$", "$M_{VY}$" or "$H_{XY}(z)$". Conveniently, processor 130 processes $Y_0(T_Y)$ with sampling rate $F_Y$ in the kilohertz region, e.g., $$F_Y = 16 \text{ kHz.} \quad (b.5)$$

used in, for example, CDMA and GSM systems, but other sampling rates $F_Y$ can also be used. Decimation factor $M_{XY}$ can have values, such as, for example:

$$M_{XY\ CDMA} = 4.2 \text{ MHz}/16 \text{ kHz} = 262.5 \text{(CDMA)} \quad (b.6)$$

$$M_{XY\ GSM} = 6.5 \text{ MHz}/16 \text{ kHz} = 406.26 \text{(GSM)} \quad (b.7)$$

The present invention is explained in reference to numeric values of equations (b.5) and (b.6) for CDMA-systems. This "CDMA-example" is not intended to be limiting. Those of skill in the art are able, based on the description herein, to also apply the present invention to others applications.

(c)

FIG. 2 illustrates simplified time diagram 105 for analog signal x(t), diagram 115 for digital signal $X_0(T_X)$, and diagram 125 for digital signal $Y_0(T_Y)$ occurring in system 100. Diagrams 105, 115, and 125 have vertical axes for signal amplitudes and horizontal axes for the time.

Diagram 105, illustrates signal x(t) (trace 108) during time t. Points 106 and 107 on trace 108 show that x(t) is sampled by A/D converter 110 in each discrete interval $T_X$. $T_X$ is the reciprocal representation of sampling rate $F_X$:

$$T_X = 1/F_X \quad (c.1)$$

According to the well known sampling theorem, $F_X$ is equal or larger than the twofold maximum frequency of $f_{max}$ of x(t):

$$F_X \geq 2 * f_{max} \quad (c.2)$$

It is convenient for further explanation to assume that A/D converter 110 uses oversampling, that means relatively large $F_X$:

$$F_X >> 2 * f_{max} \quad (c.3)$$

$$F_X > M_{XY} * 2 * f_{max} \quad (c.4)$$

In the CDMA-example, voice (e.g., $f_{max} \approx 8$ kHz) is oversampled with the interval:

$$T_{X\ CDMA} = 1/F_{X\ CDMA} \approx 0.238 \ \mu s \quad (c.5)$$

or in other words, $T_X$ is approximately a quarter (¼) of a micro second.

Diagram 115 illustrates digital signal $X_0(T_X)$ during discrete time intervals $T_X$ (e.g., $T_{X\ CDMA}$). To indicate that $X_0(T_X)$ is assumed to be constant during $T_X$, horizontal signal traces 116 and 117 illustrate $X_0(T_X)$ parallel to the time axis $T_X$. Auxiliary traces 119 go vertically between traces 116, 117 and the time axis. Traces 119 are not part of the signal and provided only for convenience. This convention is applied also in other diagrams.

Converter 110 provides $X_0(T_X)$ for every time interval $T_X$. Preferably, digital signal $0_X(T_X)$ has a binary data range $\{X_0\}$ with positive ("+1", traces 116) and negative ("−1", traces 117) values:

$\{X_0\} = \{-1; +1\}$ (c.6)

For example, $X_0(0)$ at $T_X=0$, $X_0(1)$ at $T_X=1$, $X_0(4)$ at $T_X=4$, $X_0(6)$ at $T_X=6$, $X_0(p)$ at $T_X=P$ (trace 116') are "+1"; and $X_0(3)$ at $T_X=3$ and $X_0(P+1)$ at $T_X=P30$ 1 are "-1". To use such a data range is convenient, but not necessary.

Diagram 125 illustrates digital signal $Y_0(T_Y)$ during discrete time intervals $T_Y$. Decimation circuit 200 provides $Y_0(\gamma)$ at $T_Y=\gamma$ (trace 126), $Y_0(\gamma+1)$ at $T_Y=\gamma+1$ (trace 127), $Y_0(\gamma+2)$ at $T_Y=\gamma+2$ (trace 128), etc. $T_Y$ is the reciprocal representation of sampling rate $F_Y$:

$T_Y = 1/F_Y$ (c.6)

In the CDMA-example, $T_Y$ is, e.g.:

$T_{Y\ CDMA} = 1/F_{Y\ CDMA} = 1/16$ kHz = 62.5 µs (c.7)

Rational decimation factor $M_{XY}$ is conveniently illustrated by looking at diagrams 115 and 125. Vertical line 129 goes from the end of time interval $T_Y=\gamma$ in diagram 125 through trace 116' with signal $X_0(P)$ in diagram 115. Vertical line 129' connects the vertical amplitude axes. Line 129 and 129' project $T_Y$ from diagram 125 to diagram 115. An integer number of P signals $X_0(T_X)$ (e.g., $X_0(0)$ to $X_0(P-1)$) fits into $T_Y$, wherein one signal (e.g., $X_0(P)$) overlaps. The number P is the integer part of $M_{XY}$:

P=integer ($M_{XY}$) (c.8)

For the CDMA-example, P is obtained as:

$P_{CDMA}$=integer ($M_{XY\ CDMA}$)=integer (262.5)=262 (c.9)

Distances of traces 126, 127 and 128 to the $T_Y$-axis symbolize a magnitude of $Y_0(T_Y)$. Conveniently, $Y_0(T_Y)$ during $T_Y=\gamma$ is represented by a digital word having U bits. Preferably, the digital words has a data range:

$\{Y_0\} = \{-[2\ \exp\ (U-1)]; [2\ \exp\ (U-1)]-1\}$ (c.10)

Preferably, U equal U=16 bits, but other values U and other ranges can also be used.

(d)

FIG. 3 illustrates a simplified block diagram of rational decimation circuit 600 of the prior art (hereinafter circuit 600) which can be used in the data processing system 100. Circuit 600 comprises serially coupled interpolation circuit 610 and decimation circuit 620. Interpolation circuit 610 receives digital signal $X_0'(T_X)$ from input terminal 611 and provides intermediate signal $V_1'(T_V)$ to line 612. Decimation circuit 620 receives intermediate signal $V_1'(T_V)$ from line 612 and provides output signal $Y_0'(T_Y)$ at output terminal 622.

Sampling rates $F_X'$ of $X_0'$, $F_V'$ of $V_1'$, and $F_Y'$ of $Y_0'$ are related as:

$F_X' < F_V'$ (d.1)

$F_V' > F_Y'$ (d.2)

$F_V' = L_{XV}' * F_X'$ (d.3)

with partial interpolation factor $L_{XV}'$;

$F_Y' = F_V'/M_{VY}'$ (d.4)

with partial decimation factor $M_{VY}'$; and $F_Y' = F_X'*(M_{VY}'/L_{XV})$ (d.5)

$F_Y' = F_X'/M_{XY}'$ (d.6)

with overall decimation factor $M_{XY}'$.

Interpolation circuit 610 comprises differentiator chain 613, interpolator 615, and integrator chain 617 serially coupled between input terminal 611 and line 612. Decimation circuit 620 comprises integrator chain 623, decimator 625, and differentiator chain 627 serially coupled between line 612 and output terminal 622. Differentiator chain 613 comprises $N_1$ differentiators 614 and differentiator chain 627 comprises $N_2$ differentiators 628. Integrator chain 617 comprises $N_1$ integrators 618 and integrator chain 623 comprises $N_2$ integrators 624.

In the CDMA-example ($M_{XY\ CDMA}$=262.5), $L_{XV}'$ and $M_{VY}'$ are conveniently chosen as:

$L_{XV}' = 4$ (d.7)

$M_{VY}' = 1050$ (d.8)

resulting in $F_V'$=16.8 MHz. Differentiator chain 613 in interpolation circuit 610 and integrator chain 623 in decimation circuit 620 operate at the relatively high sampling rates $F_X'$ and $F_V'$, respectively, which is not wanted. In the CDMA-example, integrator chain 623 must accommodate signal changes which occur at time intervals $T_V' = 1/F_V' \approx 0.06$ µs (d.9)

Such short intervals $T_V'$ are similar to the operation time of hardware components in which the integrators are often implemented.

(e)

FIGS. 4–5 illustrate a simplified block diagram of rational decimation circuit 200 (hereinafter circuit 200) of the present invention. Circuit 200 is the preferred embodiment used in system 100 of FIG. 1. FIGS. 4–5 are connected by placeholder ① and should be considered together. Circuit 200 comprises integration filter 210 (FIG. 4) and FIR-filter 220 (FIG. 5) shown by dashed frames. Integration filter 210 has N integrator blocks 230-n (hereinafter INTEG n) and interpolator block 250 or "converter" (hereinafter CONV). INTEG 1 to INTEG N are collectively referred to as integrator chain 230 (dashed frame). FIR-filter 220, is preferably, a polyphase filter with K filter channels 260-k (k=1 to K, dashed frames), optional commutator 290 (hereinafter MUX), and control block 300 (hereinafter CONTROL). Filter channel 260-k has multiplier unit 270-k (hereinafter MULT k) and accumulator unit 280-k (hereinafter ACCU k). The term "commutator" is intended to include multiplexers, switches or other circuits which select one signal out of a plurality of signals.

In FIGS. 4–5, arrows→on connection lines indicate a preferred signal flow direction. In the next paragraphs of this section (e), numbers 510 to 550 in brackets [ ] refer to method steps of 500 which will be explained in detailed in connection with FIG. 10. In integration filter 210, INTEG 1 receives input signal $X_0$ from input terminal 211 and provides intermediate signal $X_1$ on line 234-1 for INTEG 2. In general, INTEG 230-n (n>1) receives signal $X_{n-1}$ on line 234-(n-1) from INTEG (n-1) and provides intermediate signal $X_n$ to line 234-n. INTEG N provides $X_N$ to line 234-N [step 510]. Preferably, the number N of integrator blocks is N=3, but other values can also be used. INTEG n can be implemented by digital circuitry well known in the art, such as counters, adders, or other means. For convenience, an example for signal $X_n(T_X)$ is explained in connection with FIG. 6. CONV receives intermediate signal $X_N(T_X)$ on line 234-N and transforms it to intermediate signal $V_1(T_V)$ on line 254 [step 520]. CONV (providing $V_1(T_V)$) can be implemented, for example, by a comb-filter described in section III of [4]. For convenience, an example for signal $V_1(T_V)$ which based on time interval $T_V$ is illustrated in FIG. 7.

In FIR-filter 220, line 254 from integration filter 210 (placeholder ①) is coupled to inputs 272-k of MULT k for substantially simultaneously distributing intermediate signal $V_1(T_V)$ to MULT 1-K. Output 276-k of MULT k provides signal $V_{2k}(T_V)$ to input 282-k of ACCU k [step 530-k]. ACCU k provides intermediate signal $W_k(T_V)$ to input 292-k of MUX [step 540-k]. At one time interval $T_Y$, bar 295 of MUX couples one of inputs 292-1 to 292-K to output 296 on output terminal 222. Thereby, circuit 200 provides output signal $Y_0(T_Y)$ [cf. FIG. 2 and step 550 of FIG. 10]. Optionally, MUX comprises register 299 coupled between output 296 and output terminal 222 for keeping $Y_0(T_Y)$ constant during $T_Y$. But this feature is not essential for the present invention.

At output 302, CONTROL simultaneously provides filter coefficients $h_k(T_V)$ (k=1 to K) ("FIR-coefficients") every $T_V$ to inputs 274-k of MULT k (k=1 to K) [within step 530-k]. An example will be explained in connection with the operation diagram of FIG. 9. At output 304, CONTROL consecutively provides reset signals $R_k$(k=1 to K) to inputs 284-k of ACCU k [step 560-k]. As illustrated by a line from output 306 to bar 295 of MUX, control block also controls MUX.

A person of skill in the art is able, based on the description herein, to implement circuit 200 by circuitry well known in the art. For example and not intended to be limiting, circuit 200 can be integrated on a monolithic chip manufactured in CMOS technology. The present invention can also be practiced on a digital signal processor (DSP) or on a general purpose processor.

When explaining the operation of circuit 200 in the following, signal propagation times trough the lines and the components are not considered for convenience.

(f)

FIG. 6 illustrates simplified time diagram 235 of digital intermediate signal $X_n(T_X)$ in circuit 200. Diagram 235 has a vertical axis for signal amplitude of $X_n(T_X)$ and a horizontal axis for discrete time intervals $T_X$, Preferably, INTEG 1 consecutively receives $X_0(T_X)$ and $X_0(T_X+1)$ and provides $X_1(T_X+1)$ (n=1) according to:

$$X_1(T_X+1):=X_1(T_X)+X_0(T_X+1) \tag{f.1}$$

wherein symbol+stands for modulo addition. For example, the "1" and "−1" sequence of signal $X_0(T_X)$ of diagram 115 (FIG. 2) is integrated to $X_1(1)=1$ $X_1(2)=1+(+1)=2$, $X_1(3)=2+(−1)=1$, $X_1(4)=1+(+1)=2$, $X_1(5)=2+(−1)=1$, etc. (f.2)

INTEG n receives $X_{n-1}(T_X)$ and $X_{n-1}(T_X+1)$ and provides $X_n(T_X+1)$ according to:

$$X_n(T_X+1):=X_n(T_X)+X_{n-1}(T_X) \tag{f.3}$$

Signals $X_n(T_X)$ have magnitudes between a minimum magnitude $X_{n\ min}$ and a maximum magnitude $X_{n\ max}$ in a preferred data range:

$$\{X_n\}=\{X_{n\ min}; X_{n\ max}\} \tag{f.4}$$

Preferably, $X_{n\ min}$ and $X_{n\ max}$ are substantially at equal distance from a zero-magnitude $X_n=0$(at the $T_X$-axis). For example, traces 236 illustrate positive $X_n$, and traces 237 illustrate negative $X_n$. Conveniently, the magnitude of signal $X_n$ can be represented by $U_n$ bits. For example, $X_{n\ min}$ and $X_{n\ max}$ can be integer numbers with opposite sign:

$$\{X_n\}=\{-2\ \exp\ (U_n-1);+[2\ \exp\ (U_n-1)]-1\} \tag{f.5}$$

Such a representation is convenient because $X_n$ has an average of zero. Preferably, the number of bits $U_n$ is equal for all INTEG 1 to INTEG N:

$$U_1=U_2=\ldots U_n=\ldots U_N=U \tag{f.6}$$

This is convenient, but not essential for the present invention. In the CDMA-example, signals $X_n$ are, preferably, represented by U=16 bits ($2^{15}$=32768), in a data range:

$$\{X_n\}=\{-32768;\ 32767\} \tag{f.7}$$

For example, INTEG n can be implemented by an accumulator whose output (i.e. $X_n(T_X+1)$) is incremented or decremented by $X_{n-1}(T_X)$. To avoid overflow, INTEG n resets automatically to minimum value $X_{n\ min}$ once maximum value $X_{n\ max}$ has been reached trace 238); and resets to a $X_{n\ max}$ once $X_{n\ min}$ has been reached. Such accumulators are well known in the art under the term "wrap-around accumulator".

INTEG n operates at longer time intervals (i.e. $T_X$) than integrators 624 in prior art circuit 200 of FIG. 3. This is an important advantage of the present invention and simplifies the hardware implementation of INTEG n.

It is known in the art that the operation speed of an integrator (e.g., INTEG n) is related to its bit resolution U. For example, a speed increase of factor 2 results in an increase of one bit resolution, of factor 4 results in an increase of 2 bits, an so on. Integrators 618 of prior art circuit 600 can be compared with INTEG n of the present invention. Integrators 618 operate at an e.g., $L_{XV}$=4 higher speed than INTEG n. Considering the number N of e.g., N=3, integrators 618 require a 2*N=2*3=6 higher bit resolution than INTEG n of the present invention.

(g)

FIG. 7 illustrates simplified time diagram 255 of digital intermediate signal $V_1(T_V)$ and defines thereby time intervals $T_V$. Diagram 255 has a vertical axis for signal amplitude of $V_1(T_V)$ and a horizontal axis for the discrete time intervals $T_V$.

Discrete time interval $T_V$ is related to $T_X$ by partial interpolation factor $L_{XV}$ and related to $T_Y$ by partial decimation factor $M_{VY}$:

$$T_V=T_X/L_{XV}\ \text{or}\ (T_X=L_{XV}*T_V) \tag{g.1}$$

$$T_V=T_Y/M_{VY}\ \text{or}\ (T_Y=M_{VY}*T_V) \tag{g.2}$$

$L_{XV}$ and $M_{VY}$ are conveniently chosen as integer factors of overall decimation factor $M_{XY}$ of circuit 200 introduced in section (b):

$$M_{XY}=M_{VY}/L_{XV} \quad (g.3)$$

Interval $T_V$ can be considered as the reciprocal representation of an intermediate sampling rate $F_V$:

$$T_V=1/F_V \quad (g.4)$$

Signal $V_1(T_V)$ has preferably, a substantially equal data range as signal $X_N(T_X)$:

$$\{V_1\}=\{X_N\} \quad (g.5)$$

Groups 251 with each $L_{XV}$ consecutive signals $$V_1(a), V_1(a+1), V_1(a+2) \ldots V_1(a+L_{XV}-1) \quad (g.6)$$

have substantially equal magnitudes which are substantially equal to the magnitude of $X_N(T_X)$:

$$V_1(s) \approx V_1(s+1) \approx V_1(s+2) \approx \ldots \approx V_1(s+L_{XV}-1) \approx X_N(T_X) \quad (g.7)$$

Rational fraction $M_{XY}$ is illustrated by measurement lines 252 and 252'. Line 252 illustrates time interval $T_Y$ (cf. FIG. 2) which comprises $M_{VY}$ signals $V_1(T_V)$. Lines 252' illustrates that only a number of $$A < M_{VY} \quad (g.8)$$

signals $V_1(T_V)$ fit completely into one time interval $T_Y$. Number A is the product of $L_{XV}$ and P:

$$A = L_{XV} * P \quad (g.9)$$

$$A = L_{XV} * \text{integer } (M_{XY}) \quad (g.10)$$

In other words, P groups 251 fit and one group (reference number 251') overlaps. In the CDMA-example ($M_{XY\,CDMA}$=262.5, $P_{CDMA}$=262), $L_{XV}$ is conveniently chosen as:

$$L_{XV}=4 \quad (g.11)$$

and $M_{VY}$ is chosen as:

$$M_{VY}=1050 \quad (g.12)$$

(h)

FIG. 8 illustrates simplified spectra of transfer function $H_{XV}(z)$ of integrator filter 210, $H_{VY}(z)$ of FIR-filter 220, and an overall transfer function $H_{XY}(z)$. Diagram 236 illustrates the frequency transfer function $H_{XV}(z)$ (vertical axis) versus the frequency F (horizontal axis). Transfer function $H_{XV}(z)$ is defined as the ratio between $V_1(z)$ and $X_0(z)$:

$$H_{XV}(z)=V_1(z)/X_0(z) \quad (h.1)$$

$H_{XV}(z)$ has poles at frequencies $F_X$, $2*F_X$, $3*F_X$ and so on. The poles are N-fold. Function $H_{XV}(z)$ is the multiple product of transfer functions $H_n(z)$ of INTEG n (for n=1 to N) and transfer function $H_V(z)$ of CONV:

$$H_{XV}(z) = H_V(z) * \prod_{n=1}^{N} H_n(z) \quad (h.2)$$

$H_n(z)$ of INTEG n can be obtained, for example, by $$H_n(z)=1/[1-z(-.L_{XY})] \quad (h.3)$$

which is the Z-transform of an integrator.
When, for example, CONV is implemented by a comb-filter (a FIR-filter with only "1" coefficients), then CONV has the transfer function $H_V(z)$:

$$H_V(z) = \frac{1-z(-L_{XV})}{1-z(-1)} \quad (h.4)$$

such as given in equation (14) of [4]. Combining equations (h.2), (h.3) and (h.4), the transfer function $H_{XV}(z)$ is written as:

$$H_{XV}(z) = \frac{1-z(-L_{XV})}{([1-z(-L_{XV})])^N * [1-z(-1)]} \quad (h.5)$$

Diagram 241 illustrates the frequency transfer function $H_{VY}(z)$ of FIR-filter 220 versus the frequency F. Transfer function $H_{VY}(z)$ is defined as the ratio between $Y_0(z)$ and $V_1(z)$:

$$H_{VY}(z)=Y_0(z)/V_1(z) \quad (h.6)$$

$H_{VY}(z)$ has substantially zeros at that frequencies (e.g., 0, $F_X$, $2*F_X$, etc.) where $H_{XV}(z)$ (diagram 236) has poles.
Diagram 256 illustrates the overall transfer function $H_{XY}(z)$ of circuit 200. Function $H_{XY}(z)$ is the product of both partial transfer functions $H_{XV}(z)$ and $H_{VY}(z)$:

$$H_{XY}(z)=H_{XV}(z)*H_{VY}(z) \quad (h.7)$$

Poles are compensated by zeros and fluctuations are substantially avoided. Transfer function $H_{XY}(z)$ is implemented by transfer functions H(z) of filter channels 260-k.

(i)

Function H(z) of filter channel 260-k ("FIR-function") can equivalently be represented in a product form (symbols II and *) and in sum form (symbol E).

$$H(z) = \prod_{n=1}^{N} [1 - z(-i_n)] * H'(z) \quad (i.1)$$

$$H(z) = [1-z(-i_1)] \ldots * [1-z(-i_n)] \ldots * [1-z(-i_N)] * H'(z) \quad (i.2)$$

$$H(z) = \sum_{v=0}^{v_{max}} h(v) * z(-v) + H''(z) \quad (i.3)$$

N is the number of zeros and $v_{max}$ is an order of H(z). In equations (i.1) and (i.2), H'(z) is an optional factor initially assumed to be H'(z)=1; and in equation (i.3), H''(z) is an additional summand initially assumed to be H''(z)=0. The product form (equations i.1 and i.2) is conveniently used discuss zeros of H(z), and the sum form is conveniently used to define filter coefficients h(v).

With the zeros, filter channel 260-k suppresses the N-fold poles of the transfer function $H_N(z)$ of equations (h.1) to (h.5). To have the zeros of H(z) at that frequencies where $H_N(z)$ has its poles, exponents $i_n$ are preferably, divisible by $L_{XV}$.

Transfer function H(z) in the product form (II) of equations (i.1) and (i.2) is transferred by polynomial multiplication well known in the art to the sum form (E) of equation (i.3). For convenience, an example is given for N=3:

$$H(z)=[1z(-i_1)]*[1-z(-i_2)]*[1z(1-i_3)] \quad (i.4)$$

$$H(z)=1-z(-i_1)-z(-i_2)+z(-i_1i_2)-z(-i_3)+z(-i_1-i_3)+z(-i_2-i_3)-z(-i_1-i_2-i_3). \quad (i.5)$$

The exponents $i_n$ are summed according to the calculation rules for powers. Filter coefficients h(v) and their indices v are obtained as follows:

(i) taking the ±sign in front of the z-operand as coefficient h(v)=+1 or h(v)=−1 and (ii) taking the sum of the exponents as position index v. The resulting coefficients are, for example:

$h(0) = +1;$ $h(i_1) = -1;$ $h(i_2) = -1;$ $h(i_1+i_2) = +1;$ $h(i_3) = -1;$ $h(i_1+i_3) = +1;$ $h(i_2+i_3) = +1;$ and $h(i_1+i_2+i_3) = -1.$ (i.6)

The first summand "1" in equation (i.5) has been considered as $1 = +z(-0)$ (i.7)

(j)

With FIR-function H(z) of equations (i.1) to (i.5), N-fold zeros are provided. FIR-function H(z) is, preferably, modified with optional factor H'(z) to obtain further zeros. H'(z) is given as follows:

$$H'(z) = \prod_{\psi=1}^{\Psi} [1 + z(-j_\psi)]$$ (j.1)

For example, H'(z) provides additional Ψ-fold zeros at $F_X*2$, so the resulting zeros of H(z) are (N+Ψ)-fold at $F_X*2$, but other frequencies can also be used. Preferably, Ψ is smaller or equal to N:

$\Psi \leq N.$ (j.2)

With optional term H'(z) written into equations (i.1) and (i.2), transfer function H(z) is expressed as:

$$H(z) = \prod_{n=1}^{N} [1 - z(-i_n)] * \prod_{\psi=1}^{\Psi} [1 + z(-j_\psi)]$$ (j.3)

$H(z) = [1-z(-i_1)]* \ldots *[1-z(-i_n)]* \ldots [1-z(-i_N)]*[1+z(-j_1)]* \ldots *[(1+z(-j_{105})]* \ldots [(1+z(-j_{105})]$ Preferably, exponents $i_n$ (n=1 to N) and $j_{105}$ (Ψ=1 to Ψ) are different between themselves:

$i_1 \neq i_2 \neq \ldots \neq i_n \neq \ldots \neq i_N$ (i.5)

$j_1 \neq j_2 \neq \ldots \neq j_{105} \neq \ldots \neq j_\Psi$ (j6)

Similar as in equations (i.4) to (i.5), the product form (Π and *) of H'(z) is transferred to the sum form (Σ), such as in a convenient example for Ψ=2:

$H'(z) = [1+z(-j_1)]*[1+z(-j_2)]$ (i.7)

$H'(z) = 1+z(-j_1)+z(-j_2)+z(-j_1j_2)$ (j.8)

H'(z) is further multiplied with the right side of equation (i.2):

$H(z) = \{1 - z(-i_1) - z(-i_2) + z(-i_1-i_2) - z(-i_3) +$ (j.9)

$z(-i_1-i_3) + z(-i_2-i_3) - z(-i_1-i_2-i_3)\} * \{1 + z(-j_1) + z(-j_2) + (-j_1-j_2)\}$

Preferably, exponents $i_n$ (n=1 to N) and $j_{105}$ (Ψ=1 to Ψ) are chosen in that way that coefficients in H(z) become either "+1", "−1", or "0". This is convenient, but not essential.

(k)

Conveniently, exponents $i_n$ and $j_\Psi$ can be obtained as follows for the CDMA-example. With, for example, $M_{XY}$ $_{CDMA}$=262.5, P=262, $L_{XY}$=4, and $A=L_{XY}*P$ exponents $i_n$ are calculated as $i_1 = A-b = 4*262-24 = 1024$ (k.1)

$i_{2-A} = 4*262 = 1048$ (k.2)

$i_3 = A+b = 4*262+24 = 1072$ (k.3)

with b being an $L_{XY}$=4 divisible integer variable (for example, b=24).

Exponents $j_{105}$ are calculated according to $c = 2*262 = 524$ (k.4)

$j_1 = c-d = 518$ (k.5)

$j_2 = c+d = 530$ (k.6)

with $c=(L_{XY}/2)*P=A/2$ (for example, c=2) and d being, preferably:

$d = /L_{XV} = 6$ (k.7)

Integer d is, preferably, an even number which is not divisible by $L_{XY}$; but other values for d can also be used.

Table I illustrates the frequency transfer function H(z) by equations (k.8) to (k.1). Equation (k.8) was obtained from equation (j.9) by multiplication and uses exponents $i_n$ ($i_1$, $i_2$, $i_3$) and $j_\Psi$ ($j_1$, $j_2$). Equation (k.9) was obtained from (k.8) by replacing $i_1$, $i_2$, $i_3$, $j_1$, and $j_2$ using A, b, c, and d as defined in equations (k.1) to (k.6). Equation (k.10) is a simplification of equation (k.9). Equation (k.11) illustrates calculation results for the CDMA-example with the numbers from equations (k.1) to (k.6). In table I, column (1) references the summands ("terms") of H(z) by incrementing numbers 1 to 32.

In equations (k.10) and (k.11), the following terms cancel each other:

$-z(-A)+z(2*c) = 0$ (term (3) and term (25)) (k.12)

$+z(-2*A+b)-z(-A+b-2*c) = 0$ (term (4) and term (26)) (k.13)

$+z(-2*A)-z(-A-2*c) = 0$ (term (5) and term (27)) (k.14)

$+z(-2*A-b)-z(-A-b-2*c) = 0$ (term (7) and term (29)) (k.15)

$-z(-3*A)+z(-2*A-2*c) = 0$ (term (8) and term (30)) (k.16)

In table I, the cancellation is illustrated by canceled terms. Function H(z) is thereby further simplified and has 22 instead of 32 terms for the example given.

TABLE I

FIR-function H(z)

| (1) H(z) = | (k.8) H(z) = | (k.9) H(z) = | (k.10) H(z) = | (k.11) H(z) = |
|---|---|---|---|---|
| 1 | 1 | 1 | 1 | 1 |
| 2 | $-z(-i_1)$ | $-z(-(A-b))$ | $-z(-A+b)$ | $-z(-1024)$ |
| 3 | $-z(-i_2)$ | $-z(-A)$ | | |
| 4 | $+z(-i_1-i_2)$ | $+z(-(A-b)-A)$ | | |
| 5 | $-z(-i_3)$ | $-z(-(A+b))$ | $-z(-A-b)$ | $-z(-1072)$ |
| 6 | $+z(-i_1-i_3)$ | $+z(-(A-b)-(A+b))$ | | |
| 7 | $+z(-i_2-i_3)$ | $+z(-A-(A+b))$ | | |
| 8 | $-z(-i_1-i_2-i_3)$ | $-z(-(A-b)-A-(A+b))$ | | |
| 9 | $+z(-j_1)$ | $+z(-(c-d))$ | $+z(-c+d)$ | $+z(-518)$ |
| 10 | $-z(-i_1-j_1)$ | $-z(-(A-b)-(c-d))$ | $-z(-A+b-c+d)$ | $-z(-1542)$ |
| 11 | $-z(-i_2-j_1)$ | $-z(-A-(c-d))$ | $-z(-A-c+d)$ | $-z(-1566)$ |
| 12 | $+z(-i_1-i_2-j_1)$ | $+z(-(A-b)-A-(c-d))$ | $+z(2*A+b-c+d)$ | $+z(-2590)$ |
| 13 | $-z(-i_3-j_1)$ | $-z(-(A+b)-(c-d))$ | $-z(-A-b-c+d)$ | $-z(-1590)$ |
| 14 | $+z(-i_1-i_3-j_1)$ | $+z(-(A-b)-(A+b)-(c-d))$ | $+z(-2*A-c+d)$ | $+z(-2614)$ |
| 15 | $+z(-i_2-i_3-j_1)$ | $+z(-A-(A+b)-(c-d))$ | $+z(-2*A-b-c+d)$ | $+z(-2638)$ |
| 16 | $-z(-i_1-i_2-i_3-j_1)$ | $-z(-(A-b)-A-(A+b)-(c-d))$ | $-z(-3*A-c+d)$ | $-z(-3662)$ |
| 17 | $+z(-j_2)$ | $+z(-(c+d))$ | $+z(-c-d)$ | $+z(-530)$ |
| 18 | $-z(-i_1-j_2)$ | $-z(-(A-b)-(c+d))$ | $-z(-A+b-c-d)$ | $-z(-1554)$ |
| 19 | $-z(-i_2-j_2)$ | $-z(-A-(c+d))$ | $-z(-A-c-d)$ | $-z(-1578)$ |
| 20 | $+z(-i_1-i_2-j_2)$ | $+z(-(A-b)-A-(c+d))$ | $+z(-2*A+b-c-d)$ | $+z(-2602)$ |
| 21 | $-z(-i_3-j_2)$ | $-z(-(A+b)-(c+d))$ | $-z(-A-b-c-d)$ | $-z(-1602)$ |
| 22 | $+z(-i_1-i_3-j_2)$ | $+z(-(A-b)-(A+b)-(c+d))$ | $+z(-2*A-c-d)$ | $+z(-2626)$ |
| 23 | $+z(-i_2-i_3-j_2)$ | $+z(-A-(A+b)-(c+d))$ | $+z(-2*A-b-c-d)$ | $+z(-2650)$ |
| 24 | $-z(-i_1-i_2-i_3-j_2)$ | $-z(-(A-b)-A-(A+b)-(c+d))$ | $-z(-3*A-c-d)$ | $-z(-3674)$ |
| 25 | $+z(-j_1-j_2)$ | $+z(-(c-d)-(c+d))$ | | |
| 26 | $-z(-i_1-j_1-j_2)$ | $-z(-(A-b)-(c-d)-(c+d))$ | | |
| 27 | $-z(-i_2-j_1-j_2)$ | $-z(-A-(c-d)-(c+d))$ | | |
| 28 | $+z(-i_1-i_2-j_1-j_2)$ | $+z(-(A-b)-A-(c-d)-(c+d))$ | $+z(-2*A+b-2*c)$ | $+z(-3120)$ |
| 29 | $-z(-i_3-j_1-j_2)$ | $-z(-(A+b)-(c-d)-(c+d))$ | | |
| 30 | $+z(-i_1-i_3-j_1-j_2)$ | $+z(-(A-b)-(A+b)-(c-d)-(c+d))$ | | |
| 31 | $+z(-i_2-i_3-j_1-j_2)$ | $+z(-A-(A+b)-(c-d)-(c+d))$ | $+z(-2*A-b-2*c)$ | $+z(-3168)$ |
| 32 | $-z(-i_1-i_2-i_3-j_1-j_2)$ | $-z(-(A-b)-A-(A+b)-(c-d)-(c+d))$ | $-z(-3*A-2*c)$ | $-z(-4192)$ |

Similar to equation (i.6), FIR-coefficients $h(T_V)$ are obtained from equation (k.11) in table I with the ±sign for "−1" and "+1" coefficients, and exponents of the z-operator as index q.

Table II illustrates a simplified FIR-function H(z). Especially, table II shows in column (1), term numbers for convenience;

in column (2), group indices g for groups of terms;

in column (3), equation (k.17) which is equation (k.9) of table I without the canceled terms and in a convenient order;

in column (4), $T_V$-indices of coefficients $h(T_V)$ as combinations of A, b, c, and d; and in column (5), coefficients $h(T_V)$ with $T_V$-indices for the CDMA-example (cf. (k.11).

TABLE II

Simplified FIR-function H(z)

| (1) | (2) | (3) | (4) | (5) |
|---|---|---|---|---|
| term | g | H(z) = | $T_V$ | $h(T_V)$(CDMA) |
| 1 | 1 | 1 | +1 | h(0) = +1 |
| 2 | 2 | $+z(-c+d)$ | c−d | h(518) = +1 |
| 3 | | $+z(-c-d)$ | c+d | h(530) = +1 |
| 4 | 3 | $-z(-A+b)$ | A−b | h(1024) = −1 |
| 5 | | $-z(-A-b)$ | A+b | h(1072) = −1 |
| 6 | 4 | $-z(-A+b-c+d)$ | A−b+c−d | h(1542) = −1 |
| 7 | | $-z(-A+b-c-d)$ | A−b+c+d | h(1554) = −1 |
| 8 | | $-z(-A-c+d)$ | A+c−d | h(1566) = −1 |
| 9 | | $-z(-A-c-d)$ | A+c+d | h(1578) = −1 |
| 10 | | $-z(-A-b-c+d)$ | A+b+c−d | h(1590) = −1 |

TABLE II-continued

Simplified FIR-function H(z)

| (1) | (2) | (3) | (4) | (5) |
|---|---|---|---|---|
| 11 | | $-z(-A-b-c-d)$ | A+b+c+d | h(1602) = −1 |
| 12 | 5 | $+z(-2*A+b-c+d)$ | 2*A−b+c−d | h(2590) = +1 |
| 13 | | $+z(-2*A+b-c-d)$ | 2*A−b+c+d | h(2602) = +1 |
| 14 | | $+z(-2*A-c+d)$ | 2*A+c−d | h(2614) = +1 |
| 15 | | $+z(-2*A-c-d)$ | 2*A+c+d | h(2626) = +1 |
| 16 | | $+z(-2*A-b-c+d)$ | 2*A+b+c−d | h(2638) = +1 |
| 17 | | $+z(-2*A-b-c-d)$ | 2*A+b+c+d | h(2650) = +1 |
| 18 | 6 | $+z(-2*A+b-2*c)$ | 2*A−b+2*c | h(3120) = +1 |
| 19 | | $+z(-2*A-b-2*c)$ | 2*A+b+2*c | h(3168) = +1 |
| 20 | 7 | $-z(-3*A-c+d)$ | 3*A+c−d | h(3662) = −1 |
| 21 | | $-z(-3*A-c-d)$ | 3*A+c+d | h(3674) = −1 |
| 22 | 8 | $-z(-3*A-2*c)$ | 3*A+2*c | h(4192) = −1 |

FIR-order Q of filter channel 260-k is calculated according to:

$$Q = \sum_{n=1}^{N} i_n + \sum_{\psi=1}^{\Psi} j_\psi + 1 \qquad (1.1)$$

For N=3 and Ψ=2, equation (1.1) is similar to term (22) in column (3) of table II.

CDMA-example, the order Q is obtained as:

$$Q = 1024 + 1048 + 1072 + 518 + 530 + 1 \qquad (1.2)$$

$$Q = 4193 \qquad (1.3)$$

The number K of filter channels 260-k is:

$$K > \text{integer}[(Q-1)/(M_{VY}+1)] \quad (1.4)$$

In the CDMA-example, K=4 fulfills the equation:

$$4 > \text{integer}[(4193-1)/(1050+1)] \quad (1.5)$$

$$4 > \text{integer}[4192/1051] \quad (1.6)$$

$$4 > 3.99 \quad (1.7)$$

It is an important advantage of the present invention, that the number of non-zero coefficients (e.g., 22 coefficients $h(T_V) \neq 0$)) is small compared to the FIR-order. This advantage contributes to a reduced power consumption during processing compared to the prior art.

(m)

Table III illustrates FIR-coefficients $h_1(T_V)$, $h_2(T_V)$, $h_3(T_V)$ and $h_4(T_V)$ (columns (2) to (5) (collectively $h_k(T_V)$) which CONTROL supplies to MULT 1 to MULT 4 of filter channels 260-1, 260-2, 260-3 and 260-4, respectively, in system 200. For convenience, column (1) indicates group index g of table II. $T_V$ in the parenthesis ( ) indicate the time interval $T_V$ by which MULT k multiplies $h_k(T_V)$ with $V_1(T_V)$. MULT 1 receives coefficients $h(T_V)$ as given in columns (5) of table II. MULT k receives coefficients $h_k(T_V)$ (channel index k) at a start time $S_k$. Start time $S_k$ of MULT k is $M_{VY}$ time intervals $T_V$ later than start time $S_{k-1}$ of MULT (k-1). In the CDMA-example, start times are $S_1=0$ for MULT 1, $S_2=M_{VY}=1050$ for MULT 2, $S_3=2*M_{VY}=2100$ for MULT 3, $S_4=3*M_{VY}=3150$ for MULT 4, in a repetition $S_1'=4*M_{VY}=4200$ for MULT 1 and so on.

TABLE III

Coefficients $h_k(T_V)$ supplied to MULT 1 to 4

| (1) g | (2) MULT1 | (3) MULT2 | (4) MULT3 | (5) MULT4 |
|---|---|---|---|---|
|   | $S_1 = 0$ | $S_2 = 1050$ | $S_3 = 2100$ | $S_4 = 3150$ |
| 1 | $h_1(0) = +1$ | $h_2(1050) = +1$ | $h_3(2109) = +1$ | $h_4(3150) = +1$ |
| 2 | $h_1(518) = +1$ | $h_2(1568) = +1$ | $h_3(2618) = +1$ | $h_4(3668) = +1$ |
|   | $h_1(530) = +1$ | $h_2(1580) = +1$ | $h_3(2630) = +1$ | $h_4(3680) = +1$ |
| 3 | $h_1(1024) = -1$ | $h_2(2074) = -1$ | $h_3(3124) = -1$ | $h_4(4174) = -1$ |
|   | $h_1(1072) = -1$ | $h_2(2122) = -1$ | $h_3(3172) = -1$ | $h_4(4222) = -1$ |
| 4 | $h_1(1542) = -1$ | $h_2(2592) = -1$ | $h_3(3642) = -1$ | $h_4(4692) = -1$ |
|   | $h_1(1554) = -1$ | $h_2(2604) = -1$ | $h_3(3654) = -1$ | $h_4(4704) = -1$ |
|   | $h_1(1566) = -1$ | $h_2(2616) = -1$ | $h_3(3666) = -1$ | $h_4(4716) = -1$ |
|   | $h_1(1578) = -1$ | $h_2(2628) = -1$ | $h_3(3678) = -1$ | $h_4(4728) = -1$ |
|   | $h_1(1590) = -1$ | $h_2(2640) = -1$ | $h_3(3690) = -1$ | $h_4(4740) = -1$ |
|   | $h_1(1602) = -1$ | $h_2(2652) = -1$ | $h_3(3702) = -1$ | $h_4(4752) = -1$ |
| 5 | $h_1(2590) = +1$ | $h_2(3640) = +1$ | $h_3(4699) = +1$ | $h_4(5740) = +1$ |
|   | $h_1(2602) = +1$ | $h_2(3652) = +1$ | $h_3(4702) = +1$ | $h_4(5752) = +1$ |
|   | $h_1(2614) = +1$ | $h_2(3664) = +1$ | $h_3(4714) = +1$ | $h_4(5764) = +1$ |
|   | $h_1(2626) = +1$ | $h_2(3676) = +1$ | $h_3(4726) = +1$ | $h_4(5776) = +1$ |
|   | $h_1(2638) = +1$ | $h_2(3688) = +1$ | $h_3(4738) = +1$ | $h_4(5788) = +1$ |
|   | $h_1(2650) = +1$ | $h_2(3700) = +1$ | $h_3(4750) = +1$ | $h_4(5800) = +1$ |
| 6 | $h_1(3120) = +1$ | $h_2(4170) = +1$ | $h_3(5220) = +1$ | $h_4(6270) = +1$ |
|   | $h_1(3168) = +1$ | $h_2(4218) = +1$ | $h_3(5270) = +1$ | $h_4(6318) = +1$ |
| 7 | $h_1(3662) = -1$ | $h_2(4712) = -1$ | $h_3(5762) = -1$ | $h_4(6812) = -1$ |
|   | $h_1(3674) = -1$ | $h_2(4724) = -1$ | $h_3(5774) = -1$ | $h_4(6824) = -1$ |
| 8 | $h_1(4192) = -1$ | $h_2(5242) = -1$ | $h_3(6292) = -1$ | $h_4(7342) = -1$ |

FIG. 9 illustrates by a simplified time diagram 400 how CONTROL provides coefficients $h_1(T_V)$, $h_2(T_V)$, $h_3(T_V)$, and $h_4(T_V)$. FIG. 9 is intended to be an example for CDMA. A person of skill in the are is able to implement CONTROL, based on the description herein, by circuitry well known in the art for the CDMA and for other applications. Coefficients $h(T_V)$ can be precalculated and stored in a memory or CONTROL can have computational elements which calculate $h(T_V)$ in real time, but such as distinction is not important for the present invention.

Horizontal line 401 indicates discrete time intervals $T_V$ which are counted from $T_V=0$. Vertical lines 451, 452, 453, 454, 455, 456, and 457 at $S_1=0$, $S_2=1050$, $S_3=2100$, $S_4=3150$, $S_1'=4200$, $S_2'=5250$, and $S_3'=6300$ (equidistant with "$M_{VY}$"), respectively, cross horizontal lines 410, 420, 430 and 440. Lines 410, 420, 430, and 440 have symbols | for coefficients $h_1(T_V)$, $h_2(T_V)$, $h_3(T_V)$, and $h_4(T_V)$, respectively. Symbols | above lines 410–440, indicate $h_k$="+1", and symbols | below lines 410–440 indicate $h_k$="–1". When at any time $T_V$, a line does not have a symbol, then coefficient $h_k(T_V)$ is zero ($h_k=0$). The time intervals between $S_k+(Q-1)$ (e.g., 4192 on line 410) and $S_k'$ (e.g., 4200) are waiting times $T_{WAIT\ k}$ in which MULT k receives $h_k=0$.

Dashed frame 530-1 [cf. step 530-1 in FIG. 10] which encloses line 410 from $T_V=0$ to $T_V=4192$ indicates a first cycle in which CONTROL sends $h_1(T_V)$ to MULT 1. Dashed frames 490-g (g=1 to 8) around the coefficient symbols | on line 420 indicate groups g of tables II and III. Dashed time line 495 at $$T_V = 1050 + 2096 = 3146 \text{(for } h_2(T_V)) \quad (m.1)$$

$$T_V = S_k + 2*A \quad (m.2)$$

illustrates that for each cycle, coefficients $h_k(T_V)$ are, preferably, in an anti-symmetric time sequence. For example, group 1 is anti-symmetric to group 8 with $h_k=(T_V)$ "+1" and "–1" coefficients; group 2 is anti-symmetric to group 7; group 3 to group 6; and group 4 to group 5.

A cycle repetition is indicated by symbols | for $h_1(T_V)$ enclosed in dashed frame 530-1'(right-side-open). The first cycle is repeated beginning with $T_V=4200$ ($K*M_{VY}$). For simplicity, further cycles for $h_2(T_V)$ (beginning at $T_V=5250$), $h_3(T_V)$ (beginning at $T_V=6300$) and $h_4(T_V)$ (beginning at $T_V=7350$) are not shown.

(n)

FIG. 10 illustrates a simplified flow chart diagram of method 500 according to the present invention. Method 500 comprises method steps 510, 520, 530-k, 540-k, 550-k and 560-k illustrated by blocks. Index k is the channel index from k=1 to K. For convenience, time axis 501 represents the time in $T_V$ intervals progressing to the right of FIG. 10. For convenience, time axis 501 gives characteristic start times $S_k$ for the CDMA-example (e.g., $S_1=0$, $S_2=1050$, $S_3=2100$, $S_4=3150$, in repetitions $S_1'=4200$, $S_2'=5250$, $S_3'=6300$, etc.) but these $T_V$-numbers are not essential for the present invention. Steps can be performed in parallel. Repetitions of steps in multiple cycles are indicated by prime markers, such as, e.g., in step 530-1' or for start times $S_k'$. For convenience, components INTEG 1-N, CONVERT, MULT k, ACCU k, and MUX of circuit 200 (FIGS. 4–5) which participate in certain steps are indicated within the blocks by bold letters. Method 500 comprises integrating step 510 performed by INTEG 1 to INTEG N, interpolating step 520 performed by CONVERT, multiplying step 530-k by MULT k and CONTROL, accumulating step 540-k by ACCU k, reading step 550-k by MUX and CONTROL, and resetting step 560-k by ACCU k and CONTROL.

In integrating step 510, INTEG 1 to INTEG N continuously integrate $X_0(T_X)$ to $X_N(T_X)$, for example as described in connection with FIG. 6. Integrating step 510 is, preferably, performed all the time.

In interpolating step 520, CONVERT continuously interpolates $X_N(T_X)$ to $V_1(T_V)$ and provides $V_1(T_V)$ to MULT 1 to MULT K. For example, CONVERT receives $X_N(T_X)$ and provides $V_1(s)$ (see FIG. 7) which goes via line 254 (FIG. 5) to MULT 1, to MULT 2, to MULT 3, and to MULT 4. Then, CONVERT provides $V_1(a+1)$ which also goes to MULT 1 to MULT 4. After having provided $V_1(a+L_{XV}-1)$, CONVERT takes $X_N(T_X+1)$ and so on. Converting step 520 is, preferably, performed, all the time.

In multiplying step 530-k CONTROL generates coefficients $h_k(T_V)$ (sections (h) to (m)). MULT k provides intermediate result, for example, according to:

$$V_{2k}=V_1(T_V)* h_k(T_V) \qquad (n.1)$$

Multiplying step 530-k is, preferably, repeated every time interval $T_V$ within $S_k$ and $S_k+(Q-1)$. In the waiting time (before new $S_k'$), coefficients $h_k$ are assumed to be at zero so that $V_{2k}=0$.

In accumulating step 540-k, ACCU k accumulates $V_{2k}(T_V)$ to $W_k(T_V)$, for example, according to:

$$T_V = S_k + (Q-1) \qquad (n.2)$$

$$W_k(T_V) = \sum_{T_V=S_k} V_{2k}(T_V)$$

For example, ACCU I receives $V_{2k}(T_V)$ beginning at $T_V=S_1=0$ and finishes the accumulation of $W_1(T_V)$ at $T_V=Q-1$. In the CDMA-example, steps 530-1 and 540-1 provide $W_1$ according to (equations n.1, n.2, and coefficients $h(T_V)$ from table II, columns (2)):

$$W_1 = +V_1(0) + V_1(518) + V_1(530) - V_1(1542) - \ldots - V_1(1602) + V_1(2590) + \ldots + V_1(2650) + V_1(3120) + V_1(3674) - V_1(4192) \qquad (n.3)$$

Accumulating step 540-k is repeated at every time interval $T_V$. For simplicity of implementation, step 540-k can also be performed during the waiting time $T_{WAIT\ k}$.

In reading step 550-k, MUX reads $W_k$ from ACCU k and forwards $W_k$ as $Y_0(T_Y)$ to output terminal 222. In reading step 550-k, register 299 can optionally store $Y_0(T_Y)$ over $T_Y$. In FIG. 10, the blocks for step 550-k are larger than the time required for performing the step which can be smaller than one time interval $T_V$.

In resetting step 560-k, CONTROL sends reset signal $R_k$ to ACCU k, so that $$W_k=0 \qquad (n.4)$$

Resetting step 560-k is performed after reading step 550-k, preferably during waiting time $T_{WAIT\ k}$. In FIG. 10, the blocks for step 560-k are larger than the time required for performing the step.

Multiplying step 530-k, accumulating step 540-k, reading step 550-k, and resetting step 560-k are cyclically repeated (steps 530-k', 540-k', 550-k', 560-k' and so on). Steps k and steps (k+1) are performed with a shift of $T_Y$.

(o)

While the present invention has been described in terms of particular structures, devices and materials, those of skill in the art will understand based on the description herein that it is not limited merely to such examples and that the full scope of the invention is properly determined by the claims that follow.

The rational decimation circuit and the method of the present invention are distinguished from the prior art by the following features: (i) The present invention uses an integration filter which integrates first and interpolates second (interpolation after integration). Prior art circuits interpolate and then integrate (interpolation before integration). (ii) A Finite Impulse Response filter "FIR-filter", coupled to the integration filter, suppresses signal fluctuations which could arise because of poles in an integrating function $H_{XV}(z)$. In the FIR-filter, "0", "-1" and "+1" filter coefficients provide a filter function $H_{VY}(z)$ which has zeros where the integrating function $H_{XV}(z)$ has poles. A resulting overall transfer function $H_{XY}(z)$ has a reduced number of poles. (iii) The FIR-filter is, preferably, a polyphase filter with a plurality of filter channels are switched by a commutator. (iv) The numbers of "+1"-coefficients and "-1"-coefficients in the FIR-filter are, preferably, equal in all filter channels. Preferably, the total number of "+1" and "-1" coefficients is larger than the total number of "0" coefficients. (v) Integrators operates at the input sampling rate and not at a higher intermediate sampling rate.

Glossary of Terms

In the following, (i) abbreviations, (ii) physical units, and (iii) writing conventions are listed alphabetically. This glossary is provided only for convenience.

| (i) Abbreviations | |
|---|---|
| a | index for signals $V_1(T_V)$ |
| A | number of signals $V_1(T_V)$ fitting into $T_Y$ |
| ACCU k | "accumulator unit" with index k |
| A/D | analog-to-digital |
| b | auxiliary variable |
| c | auxiliary variable |
| CDMA | Code Division Multiple Access |
| CONV | "interpolator block" or "converter" |
| CONTROL | "control block" |
| d | auxiliary variable |
| DSP | Digital Signal Processing |
| f | frequency of an analog signal $x(t)$ |
| $f_{max}$ | maximum frequency f of an analog signal |
| F | sampling rate, frequency |
| $F_{X\ CDMA}$ | sampling rate for CDMA, $F_{X\ CDMA}$ = 4.2 MHz |
| $F_{X\ GSM}$ | sampling rate for GSM, $F_{X\ GSM}$ = 6.5 MHz |
| $F_X$ | input sampling rate, e.g., $F_X = F_{X\ GSM}$ or $F_X = F_{X\ CDMA}$ |
| $F_Y$ | output sampling rate, e.g., $F_Y$ = 16 kHz, $F_Y \geq f_{max}$ |
| $F_V$ | intermediate sampling rate |
| FIR | Finite Impulse Response |
| GSM | Global System for Mobile Communication |
| i | exponent for z operator |
| INTEG n | "integrator block", with index n |
| j | exponent for z operator |
| H(z) | frequency transfer function, in general |
| $H_n(z), H_N(z)$ | frequency transfer function of N integrator blocks n |
| $H_V(z)$ | frequency transfer function of an interpolator block |
| $H_{XV}(z)$ | frequency transfer function of an integration filter |
| $H_{VY}(z)$ | frequency transfer function of an FIR-filter |
| $H_{XY}(z)$ | overall transfer function |
| $h(v), h(T_V)$ | FIR-coefficients |
| K | number of channels |
| k | index for channels k = 1 to K |
| L | interpolation factor |
| $L_{XV}$ | interpolation factor of an interpolator block, e.g., $L_{XV}$ = 4 |
| M | decimation factor |
| $M_{XY}$ | overall decimation factor $M_{XY} = F_X/F_Y$ |
| MULT k | "multiplier unit" with index k |
| MUX | "commutator" or "multiplexer" |
| N | number of integrator blocks |
| n | index for integrator block n = 1 to N |
| $U_n, U$ | word length of signals $X_n, Y_0$, in bits, e.g., U = 16 bits |
| p | counter for time intervals $T_X$ |
| P | number of time interval $T_X$ fitting into $T_Y$ |
| Q | FIR-order and number of FIR-coefficients $h(T_V)$ |
| $R_k$ | reset signal for ACCU k |
| $S_k$ | start interval for channel k |
| t | time, in general |
| T | discrete time interval |
| $T_X$ | discrete time interval being $T_X = 1/F_X$ |

-continued

| | |
|---|---|
| $T_Y$ | discrete time interval being $T_Y = 1/F_Y$ |
| x(t) | analog signal |
| $X_0(T_X)$ | digital input signal having sampling rate $F_X$ |
| $X_n(T_X)X_N(T_X)$ | intermediate signal after an integrator n or N |
| $Y_0(T_Y)$ | digital output signal having sampling rate $G_Y$ |
| $V_1(T_V)$ | digital intermediate signal after interpolator block |
| $W_k(T_V)$ | digital intermediate signal in channel k |
| z | operator in the z-domain |
| { $X_0$ } | preferred data range of input signal $X_0(T_X)$, e.g., { −1; +1 } |
| { $X_n$ } | preferred data range of signal $X_n(T_X)$ { $-2^{(U-1)}$; $2^{(U-1)}-1$ }, preferred e.g., for U = 16: { −32768; 32767 } |
| { 0, $Y_{max}$ } | preferred data range of output signal $Y_0$ |
| $\Theta(\theta)$ | time discrete signal |
| $\theta$ | counter for time discrete signal $\Theta(\theta)$ |
| $\gamma$ | counter for time intervals $T_Y$ |
| $\nu, \nu_{max}$ | index for coefficients h($\nu$) |
| $\psi$ | index for factors |
| $\Psi$ | number of factors |
| ① | a placeholder |

(ii) Physical Units

| | |
|---|---|
| Hz | Hertz for the frequency |
| kHz | kilo hertz |
| MHz | megahertz |
| s | second for the time |
| ms | milli second |
| $\mu$s | micro second |

(iii) Writing Conventions

| | |
|---|---|
| a exp (b) | "a" to the power of "b", for example, 2 exp (3) = $2^3$ = 8 "b" is the "exponent" |
| z(−c) | z exp(−c) = $z^{-c}$ |
| * | multiplication |
| \ and — | division |
| Π | product of multiple factors |
| Σ | sum of multiple summands |
| ∞ | infinite |
| integer (M) | integer part of e.g., M, e.g., integer (3.6) = 3, integer (7.2) = 7 |

We claim:

1. A method for converting a sampling rate $F_X$ of an input signal $X_0$ to a sampling rate $F_Y=F_X/M_{XY}$ of an output signal $Y_0$, with $M_{XY}$ being an overall decimation factor, said method comprising the steps of:
integrating said input signal $X_0$ to an intermediate signal $X_N$ without changing said sampling rate $F_X$;
interpolating said intermediate signal $X_N$ to an intermediate signal $V_1$ having a sampling rate $F_V=L_{XV}*F_X$, with $L_{XV}$ being an intermediate decimation factor;
multiplying said intermediate signal $V_1$ with filter coefficients $h_k$ and accumulating the products to provide intermediate signals $W_k$, with cycles starting at distances $M_{VY}=M_{XY}*L_{XY}$, with $M_{VY}$ being an intermediate decimation factor; and
reading every $T_Y=1/F_Y$ said intermediate signal $W_k$ to provide said output signal $Y_0$.

2. The method of claim 1 further comprising a resetting step being performed at the send of said cycles to set said intermediate signals $W_k$ to zero.

3. The method of claim 1 wherein $L_{XV}=4$.

4. The method of claim 1 wherein said filter coefficients $h_k$ have values "+1", "−1" and "0" arranged in an anti-symmetric time sequence.

5. The method of claim 1 wherein said integrating step is performed by N integrators, and wherein said filter coefficients $h_k$ are calculated by polynomial multiplication of $$H(z) = \prod_{n=1}^{N} [1 - z(-i_n)] * H'(z)$$

with exponents "$i_n$" being divisible by said intermediate interpolation factor $L_{XV}$ and H'(z) a factor with any value.

6. The method of claim 5 wherein said factor H'(z) is $$H'(z) = \prod_{\psi=1}^{\Psi} [1 + z(-j\psi)]$$

with $\Psi \leq N$.

7. A method for converting
a first time discrete signal $X_0(T_X)$ based on first time intervals $T_X$ to
a second time discrete signal $Y_0(T_Y)$ based on second time intervals $T_Y=M_{XY}*T_X$, with $M_{XY}>1$ being a decimation factor,
said method using a third, intermediate signal $V_1(T_V)$ based on third time intervals $T_V=L_{XV}*T_X$;
said method comprising the following steps:
continuously integrating $X_0(T_X)$ to a fourth, intermediate signal $X_N(T_X)$;
continuously interpolating $X_N(T_X)$ to $V_1(T_V)$; and
in K cycles identified by index k;
(i) multiplying $V_1(T_V)$ with FIR-coefficients $h_k(T_V)$ to obtain fifth, intermediate signals $V_{2k}(V_T)=V_1(T_V)*h_k(T_V)$;
(ii) accumulating $V_{2k}(T_V)$ to a sixth, intermediate signal $W_k(T_V)$;
(iii) repeating steps (i) and (ii) for Q−1 time intervals $T_V$, with Q being an FIR-order;
(iv) providing $Y_0(T_Y)$ as $W_k(T_V)$;
(v) resetting $W_k$, with said K cycles being performed in parallel wherein cycles k and k+1 start with $M_{VY}*T_V$ time shifts.

8. The method of claim 7 wherein $Q<M_{VY}*L_{XV}$.

9. The method of claim 7 wherein K>integer [(Q−1)/($M_{VY}$+1)].

10. The method of claim 7 wherein said FIR-coefficients $h_k(T_V)$, used in said multiplying step (i), provide a frequency transfer function with zeros at that frequencies at which poles are produced during said integrating and interpolating steps.

11. The method of claim 7 wherein said FIR-coefficients $h_k(T_V)$ are calculated by polynomial multiplication of $$H(z) = \prod_{n=1}^{N} [1 - z(-i_n)] * \prod_{\psi=1}^{\Psi} [1 + z(-j\psi)]$$

with H(z) being a transfer function for steps (i) to (v) canceling poles of said integrating and interpolating steps, exponents $i_n$ being divisible by $L_{XV}$.

12. An apparatus for transforming a first signal having a first sampling rate to a second signal having a second sampling rate, said apparatus comprising:
a first filter receiving said first signal, integrating said first signal and interpolating said first signal to a third, intermediate signal having a third sampling rate, said first filter having a first frequency transfer function with poles; and
a second filter receiving said third signal and providing said second signal, said second filter having a second frequency transfer function with zeros at some or all of frequencies at which said first filter has said poles, said apparatus having an overall transfer function in which some or all poles of said first filter are canceled.

13. The apparatus of claim 12 wherein said first sampling rate is smaller than said second sampling rate and wherein said third sampling rate is larger than said second sampling rate.

14. The apparatus of claim 12 wherein said first filter integrates said first signal by N integrators and said second filter provides zeros which are at least N-fold.

15. The apparatus of claim 12 wherein said second filter employs K channels and a multiplexer, (i) each channel at said third sampling rate multiply said third signal with FIR-coefficients to provide fourth, intermediate signals, and accumulate said fourth signals to provide sixth, intermediate signals, (ii) said multiplexer at said second sampling rate forwarding said sixth, intermediate signals to said second signals.

16. The apparatus of claim 12 wherein said second filter employs K channels which are FIR-filters of the order Q, said Q/K being smaller than the ratio between said third sampling rate and said first sampling rate.

17. The apparatus of claim 12 wherein said second filter employs K channels, a multiplexer and a control block, channels filtering said third signal to K filter signals, said multiplexer at said second sampling rate transferring said filter signals to said second signal, and said control block providing cycles of FIR-coefficients to said channels.

18. An apparatus for providing a rational decimation by transferring a first, high sampling rate $1/T_X$ of an input signal $X_0(T_X)$ to a second, lower sampling rate $1/T_Y$ of an output signal $Y_0(T_Y)$, said apparatus comprising:

an integration filter having
an integrator chain for integrating said input signal $X_0(T_X)$ to an intermediate signal $X_N(T_X)$,
an interpolator block for interpolating $X_N(T_X)$ to an intermediate signal $V_1(T_V)$ at a third, highest sampling rate $1/T_V$; and a FIR-filter for decimating $V_1(T_V)$ to said output signal $Y_0(T_Y)$, said FIR-filter employing FIR-coefficients such that poles introduced to the spectrum of $V_1(T_V)$ by a first transfer function of said integration filter are canceled by zeros in the spectrum of a second transfer function of said FIR-filter.

19. The apparatus of claim 18 wherein said integrator chain comprises N serially arranged integrator block and wherein said second transfer function has at least N-fold zeros.

20. The apparatus of claim 18 wherein said integrator chain comprises wrap-around accumulators.

21. The circuit of claim 18 wherein said interpolator is implemented by a comb-filter.

22. The circuit of claim 18 wherein said FIR-filter comprises K filter channels which are multiplexed and operate time-shifted.

23. The circuit of claim 18 wherein said FIR-filter comprises K filter channels:
$K=[(Q-1)/(M_{VY}+1)]$, with Q being an FIR-order of said channels and $M_{VY}$ being $M_{VY}=T_Y/T_V$.

* * * * *